United States Patent
Wei et al.

(10) Patent No.: US 8,679,924 B2
(45) Date of Patent: Mar. 25, 2014

(54) SELF-ALIGNED MULTIPLE GATE TRANSISTOR FORMED ON A BULK SUBSTRATE

(75) Inventors: Andy Wei, Dresden (DE); Vivien Schroeder, Ottendorf-Okrilla (DE); Thilo Scheiper, Dresden (DE); Thomas Werner, Moritzburg (DE); Johannes Groschopf, Radebeul (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 251 days.

(21) Appl. No.: 13/017,558

(22) Filed: Jan. 31, 2011

(65) Prior Publication Data
US 2011/0291196 A1 Dec. 1, 2011

(30) Foreign Application Priority Data
May 31, 2010 (DE) .......... 10 2010 029 527

(51) Int. Cl.
*H01L 21/336* (2006.01)
(52) U.S. Cl.
USPC ............. 438/283; 257/E21.014; 257/E21.421
(58) Field of Classification Search
USPC ........... 438/283; 257/365, E21.014, E21.421, 257/E29.264
See application file for complete search history.

(56) References Cited

U.S. PATENT DOCUMENTS

| | | | |
|---|---|---|---|
| 2008/0029821 A1 | 2/2008 | Yamagami et al. | 257/365 |
| 2009/0114979 A1 | 5/2009 | Schulz | 257/327 |
| 2009/0302372 A1 | 12/2009 | Chang et al. | 257/327 |
| 2011/0062520 A1* | 3/2011 | Brask et al. | 257/348 |

OTHER PUBLICATIONS

Translation of Official Communication from German Patent Office for German Patent Application No. 10 2010 029 527.2-33 dated Jan. 24, 2011.

* cited by examiner

*Primary Examiner* — Colleen Matthews
*Assistant Examiner* — Colleen E Snow
(74) *Attorney, Agent, or Firm* — Amerson Law Firm, PLLC

(57) ABSTRACT

Three-dimensional transistors in a bulk configuration may be formed on the basis of gate openings or gate trenches provided in a mask material. Hence, self-aligned semiconductor fins may be efficiently patterned in the underlying active region in a portion defined by the gate opening, while other gate openings may be efficiently masked, in which planar transistors are to be provided. After patterning the semiconductor fins and adjusting the effective height thereof, the further processing may be continued on the basis of process techniques that may be commonly applied to the planar transistors and the three-dimensional transistors.

14 Claims, 16 Drawing Sheets

SELF-ALIGNED MULTIPLE GATE TRANSISTOR FORMED ON A BULK SUBSTRATE

BACKGROUND OF THE INVENTION

1. Field of the Invention

Generally, the present disclosure relates to highly sophisticated integrated circuits including transistor elements having a double gate (FinFET) or triple gate architecture.

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout, wherein field effect transistors represent one important type of circuit element that substantially determines performance of the integrated circuits. Generally, a plurality of process technologies are currently practiced, wherein, for many types of complex circuitry, including field effect transistors, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a planar transistor architecture, on the distance between the source and drain regions, which is also referred to as channel length.

Presently, the vast majority of integrated circuits are based on silicon due to its substantially unlimited availability, the well-understood characteristics of silicon and related materials and processes and the experience gathered during the last 50 years. Therefore, silicon will likely remain the material of choice for future circuit generations designed for mass products. One reason for the dominant importance of silicon in fabricating semiconductor devices has been the superior characteristics of a silicon/silicon dioxide interface that allows reliable electrical insulation of different regions from each other. The silicon/silicon dioxide interface is stable at high temperatures and, thus, allows the performance of subsequent high temperature processes, as are required, for example, for anneal cycles to activate dopants and to cure crystal damage without sacrificing the electrical characteristics of the interface.

For the reasons pointed out above, in field effect transistors, silicon dioxide is preferably used as a gate insulation layer that separates the gate electrode, frequently comprised of polysilicon or other metal-containing materials, from the silicon channel region. In steadily improving device performance of field effect transistors, the length of the channel region has been continuously decreased to improve switching speed and drive current capability. Since the transistor performance is controlled by the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length for a planar transistor configuration requires an increased capacitive coupling to avoid the so-called short channel behavior during transistor operation. The short channel behavior may lead to an increased leakage current and to a dependence of the threshold voltage on the channel length. Aggressively scaled transistor devices with a relatively low supply voltage and thus reduced threshold voltage may suffer from an exponential increase of the leakage current, while also requiring enhanced capacitive coupling of the gate electrode to the channel region. Thus, the thickness of the silicon dioxide layer has to be correspondingly decreased to provide the required capacitance between the gate and the channel region. The relatively high leakage current caused by direct tunneling of charge carriers through an ultra-thin silicon dioxide gate insulation layer may reach values for an oxide thickness in the range of 1-2 nm that may not be compatible with requirements for performance driven circuits.

In view of further device scaling based on well-established materials, new transistor configurations have been proposed in which a "three-dimensional" architecture may be provided in an attempt to obtain a desired channel width, while at the same time maintaining efficient controllability of the current flow through the channel region. To this end, so-called FinFETs have been proposed in which a thin sliver or fin of silicon may be formed in a thin active layer of a silicon-on-insulator (SOI) substrate, wherein, on both sidewalls, a gate dielectric material and a gate electrode material may be provided, thereby realizing a double gate transistor, the channel region of which may be fully depleted. Typically, in sophisticated applications, the width of the silicon fins is on the order of 10 nm and the height thereof is on the order of 30 nm. In a modified version of the basic double gate transistor architecture, a gate dielectric material and a gate electrode may also be formed on a top surface of the fin, thereby realizing a tri-gate transistor architecture.

Basically, FinFET transistors may provide superior channel controllability since the channel region within the semiconductor fin may be controlled on the basis of at least two, in a double-gate transistor, and three, in a tri-gate transistor, gate portions, wherein, at the same time, the effective channel width may be increased compared to planar transistor configurations so that, for given lateral transistor dimensions, an increased packing density of sophisticated transistors may be provided compared to conventional planar transistor designs. On the other hand, the three-dimensional nature of the semiconductor fin comprising the channel region may result in additional process complexity, for instance for patterning the gate electrode structure, respective spacer elements and the like, wherein, additionally, compatibility with conventional planar transistor architectures may be difficult to be achieved. Moreover, conventional FinFET transistors may suffer from an increased parasitic capacitance and, in particular, a moderately high external resistance, i.e., a resistance for connecting to the drain and source regions, which may mainly be caused by the epitaxially grown additional drain and source material for connecting the individual fin portions at the drain side and the source side of the FinFET transistor on the basis of highly complex epitaxial growth processes.

With reference to FIGS. 1a-1d, the basic configuration of conventional FinFETs and specific characteristics associated with conventional manufacturing techniques will be described in more detail.

FIG. 1a schematically illustrates a perspective view of a semiconductor device 100 that comprises a conventional FinFET transistor 150 on the basis of an SOI substrate. That is, the semiconductor device 100 comprises a substrate 101, such as a silicon substrate, above which is formed a buried insulating layer 102, typically in the form of a silicon dioxide material. Furthermore, a plurality of semiconductor fins 110 are provided and represent the "residues" of a silicon layer (not shown) initially formed on the buried insulating layer 102. The fins 110 comprise a source region 110S and a drain region 110D and a channel region 110C, which is to be considered as the central portion of the fins 110 that connects to the corresponding end portions, i.e., the drain and source regions 110D, 110S. The extension of the channel region 110C along the length direction of the transistor 150, i.e., along the length direction of the fins 110, is determined by a gate electrode structure 120 which comprises an appropriate electrode material 121, such as a polysilicon material and a spacer structure 122 comprised of any appropriate material or material system. It should be appreciated that the gate electrode structure 120 also comprises a gate dielectric material (not shown) that is formed on any surface areas of the channel region 110C that are in contact with the gate electrode structure 120. That is to say, the gate dielectric material (not shown) separates the electrode material 121 from the semiconductor material of the channel region 110C at the sidewalls of the fins 110 and, if a tri-gate transistor is considered, at a top surface of the fins 110. Typical dimensions of the fins 110, for instance for obtaining a fully depleted channel in the channel region 110C, are in the range of 10-12 nm for the fin width, while a height thereof may be selected to be approximately 30 nm.

Typically, the semiconductor device 100 comprising the FinFET 150 is formed by patterning the initially provided silicon layer formed on the buried insulating layer 102, requiring sophisticated lithography and patterning strategies. Prior to or after the patterning of the fins 110, an appropriate well dopant species may be incorporated, wherein, due to the SOI architecture of the transistor 150, any well isolation implantations are not required. Thereafter, the gate electrode structure 120 is formed, for instance by depositing a gate dielectric material and the electrode material 121, possibly including a planarization process due to the pronounced surface topography caused by the plurality of fins 110. During the patterning of the gate electrode structure 120, a complex etch process has to be applied since the patterning process has to stop at two different height levels, i.e., on the top surface of the fins 110 and on the buried insulating layer 102. Similarly, after incorporating appropriate drain and source implantation species for source and drain extension regions, the spacer structure 122 has to be provided on the basis of sophisticated etch techniques, wherein the etch process also has to stop at two different height levels.

As previously discussed, typically, the drain and source resistance may be moderately high for the transistor 150, when the individual semiconductor fins 110 may be connected "externally," for instance via the contact level of the device 100 that is to be formed in a later manufacturing stage. Consequently, in typical manufacturing strategies, an additional semiconductor material may be grown between the individual semiconductor fins 110 in order to provide a substantially continuous drain and source area (not shown), which may then be contacted by any appropriate contact regime. A corresponding selective epitaxial growth process, however, significantly contributes to the overall process complexity in forming the device 100, wherein, additionally the resulting overall series resistance of the transistor 150, i.e., of the plurality of fins 110, is nevertheless higher than expected so that the overall transistor performance is less pronounced, compared to conventional planar transistors, than expected. Furthermore, significant dopant diffusion into the buried oxide material may occur and may also contribute to inferior drive current capability of the semiconductor fins 110, even if provided with an intermediate epitaxially grown semiconductor material in the drain and source areas.

FIG. 1b schematically illustrates the device 100 wherein the transistor 150 is provided in a "bulk" configuration. That is, the semiconductor fins may be formed in an upper portion of the crystalline substrate material 101, thereby providing an additional silicon volume in the semiconductor fins 110. On the other hand, the electrically "effective" height of the semiconductor fins 110 is adjusted by a dielectric material 102A, for instance in the form of silicon dioxide, which may also electrically isolate the various fins 110. In addition to the dielectric material 102A for defining the electrically effective height of the fins 110 and for laterally isolating the fins, an appropriate isolation structure (not shown) is required for the bulk configuration of the device 100 in FIG. 1b.

With reference to FIGS. 1c-1d, certain characteristics of the SOI configuration and the bulk configuration, respectively, and any problems associated therewith, will be described in more detail.

FIG. 1c schematically illustrates the semiconductor device 100 according to the SOI configuration, as is also described with reference to FIG. 1a. As discussed above, a resistance, indicated as 105, for connecting to the drain and source regions 110D, 110S is to be reduced by, for instance, epitaxially growing an additional semiconductor material on and between the semiconductor fins 110, followed by an appropriate etch process to remove any excess material so as to provide appropriate conditions for a subsequent silicidation process, however, without significantly contributing to additional parasitic capacitance between the drain and source regions and the gate electrode. The resistance in the semiconductor fins 110 is determined by the width, indicated as 110W, and the height, indicated by 110H, which in turn may be selected so as to obtain a fully depleted transistor behavior. On the other hand, increasing width and/or height may provide a reduced overall resistance of the semiconductor fins 110. Furthermore, overall conductivity of the fins 110 may be affected by a dopant depletion, for instance in drain and source extension regions, i.e., in a region covered by the spacer structure 122, caused by dopant migration into the buried oxide material 102. Moreover, performance of the transistor 150 may be influenced by the parasitic capacitance between the gate electrode and source/drain areas of the fins 110, which could be partially compensated for by selecting shorter and wider fins. Furthermore, as is well known in complex planar transistor architectures, a plurality of performance enhancing mechanisms are implemented, for instance in the form of strain-inducing mechanisms, in order to appropriately modify the charge carrier mobility in the channel region, which directly translates into superior transistor performance. Appropriate strain-inducing mechanisms may be provided in the form of highly stressed dielectric layers formed above the transistors, for instance by providing at least a portion of the interlayer dielectric material of the contact level as a highly stressed material. Any such strain-inducing mechanisms may be less efficient for the configuration as shown in FIG. 1c and thus other appropriate strain-inducing mechanisms may have to be developed. Furthermore, embedded strain-inducing semiconductor materials may generally have a reduced efficiency in SOI configurations, in particular when implemented in the Fin-FET as shown in FIG. 1c.

FIG. 1d schematically illustrates the bulk configuration of the device 100, wherein the overall series resistance 105 of the semiconductor fins 110 may be less, compared to the SOI configuration, since, generally, an increased silicon volume may be available in the fins 110 due to the bulk configuration, while, additionally, significant dopant loss into any underlying oxide material is avoided. On the other hand, the resulting parasitic capacitance 104 may be comparable to the SOI configuration, thereby providing, in total, the superior performance of the bulk configuration with respect to the external resistance 105 and the parasitic capacitance 104. Moreover, for vertically isolating the semiconductor fins, a well isolation implantation 106 may be required, which in turn may provide additional potential for appropriately adjusting performance of the device 100 according to a bulk configuration. With respect to strain-inducing mechanisms, any overlying stressed dielectric materials may also be significantly less efficient, comparable to the situation of the SOI configuration described above, while, on the other hand, any embedded strain-inducing semiconductor material may have a somewhat higher efficiency in the bulk configuration, however, with a generally very reduced effect.

Thus, generally, three-dimensional transistor configurations, for instance in the form of SOI and bulk architectures, may provide the potential of increasing transistor performance for given lateral dimensions compared to a planar transistor architecture, wherein, however, additional process complexity may be introduced, for instance, in view of patterning gate electrode structures, providing spacer elements and the like. Furthermore, highly complex epitaxial growth processes may be required to provide appropriate contact resistance in the drain and source areas, which may nevertheless result in a moderately high contact resistance. Additionally, performance enhancing mechanisms, such as stressed dielectric layers, embedded strain-inducing semiconductor materials and the like, may be substantially non-effective, or may have a significantly reduced efficiency compared to planar transistor configurations and may thus require the new development of appropriate mechanisms. Furthermore, conventional FinFET architectures may not be compatible with planar transistor architecture, or may at least require additional process complexity for providing concurrently three-dimensional transistors and planar transistors. For example, for SOI FinFETs, the required height of the semiconductor fins requires the provision of an appropriately thin semiconductor base material which, however, may be inappropriate for forming planar transistors, since a corresponding thickness of approximately 30 nm may not be appropriate for neither fully depleted planar transistors nor for partially depleted SOI transistors. Furthermore, any other passive semiconductor elements may have to be provided in the substrate material. The bulk configuration for forming three-dimensional transistors and planar transistors may require significant process adaptations, for instance with respect to gate patterning processes, spacer etch processes and the like.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure generally provides semiconductor devices and manufacturing techniques in which three-dimensional transistors, such as double-gate or tri-gate transistors, may be formed on the basis of a silicon bulk substrate, wherein semiconductor fins may be provided in a self-aligned manner with respect to the gate electrode, i.e., the length of the semiconductor fins may be adjusted on the basis of a gate patterning process, thereby providing continuous drain and source areas which connect to the plurality of self-aligned semiconductor fins. In illustrative aspects disclosed herein, the gate electrode structure, i.e., at least the gate electrode material and the gate dielectric material, may be provided on the basis of an inlaid process technique based on appropriate mask material and a gate opening through which the self-aligned semiconductor fins may be formed for three-dimensional transistors, while, concurrently, planar transistor elements may be formed during the same process sequence by appropriately masking the semiconductor material. Consequently, based on the principles disclosed herein, double-gate or tri-gate transistors, which will be referred to hereinafter as FinFETs, may be formed together with planar transistors, if required, by using process techniques which may basically be well established in the field of planar transistor configuration, thereby providing a very efficient overall manufacturing flow.

One illustrative method disclosed herein comprises forming a first mask layer above a semiconductor layer of a semiconductor device, wherein the first mask layer comprises a gate opening that defines a lateral size and position of a gate electrode. Furthermore, the method comprises forming a second mask layer in the gate opening, wherein the second mask layer comprises a plurality of mask features defining a lateral size and position of a plurality of fins to be formed in the semiconductor layer. Additionally, the method comprises performing an etch process using the first and second mask layers so as to form the fins in a portion of the semiconductor layer. The method further comprises forming a gate electrode structure in the gate opening after removal of the second mask layer, wherein the gate electrode structure comprises the gate electrode and connects to the plurality of fins.

A further illustrative method disclosed herein relates to forming a semiconductor device. The method comprises forming a first gate opening and a second gate opening in a first mask layer that is formed above a semiconductor layer, wherein the first and second gate openings define the lateral position and size of a first gate electrode structure and a second gate electrode structure, respectively. The method further comprises forming a plurality of fins in the semiconductor layer through the first gate opening, while the second gate opening is masked. Additionally, the method comprises forming a first gate electrode structure in the first gate opening, wherein the first gate electrode structure is in contact with the plurality of fins. Moreover, the method comprises forming a second gate electrode structure in the second gate opening and forming drain and source regions in the semiconductor layer adjacent to the first and second gate electrode structures.

One illustrative semiconductor device disclosed herein comprises an isolation structure formed in a semiconductor layer and laterally delineating a semiconductor region that has a length dimension and a width dimension. The semiconductor device further comprises a drain region and a source region formed in the semiconductor region. Furthermore, a plurality of semiconductor fins are formed in the semiconductor region and extend between the drain region and the source region. The semiconductor device further comprises a gate electrode structure formed above the semiconductor fins and extending along the width dimension and above a portion of the isolation structure. Furthermore, the semiconductor device comprises a dielectric material formed below the gate electrode structure and between the plurality of fins, wherein the dielectric material extends to a height level that is less than a height level of the isolation structure.

BRIEF DESCRIPTION OF THE DRAWINGS

The disclosure may be understood by reference to the following description taken in conjunction with the accompanying drawings, in which like reference numerals identify like elements, and in which.

Figure 1B:
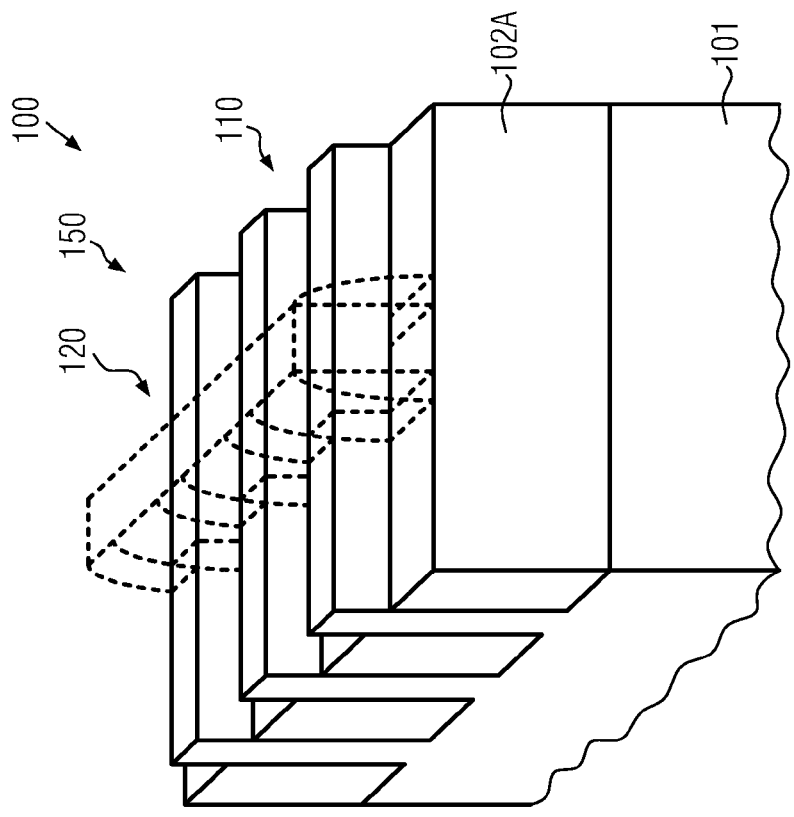
FIGS. 1a-1d schematically illustrate perspective views of a FinFET transistor, according to conventional transistor architectures, in an SOI and a bulk configuration.
Figure 1A:
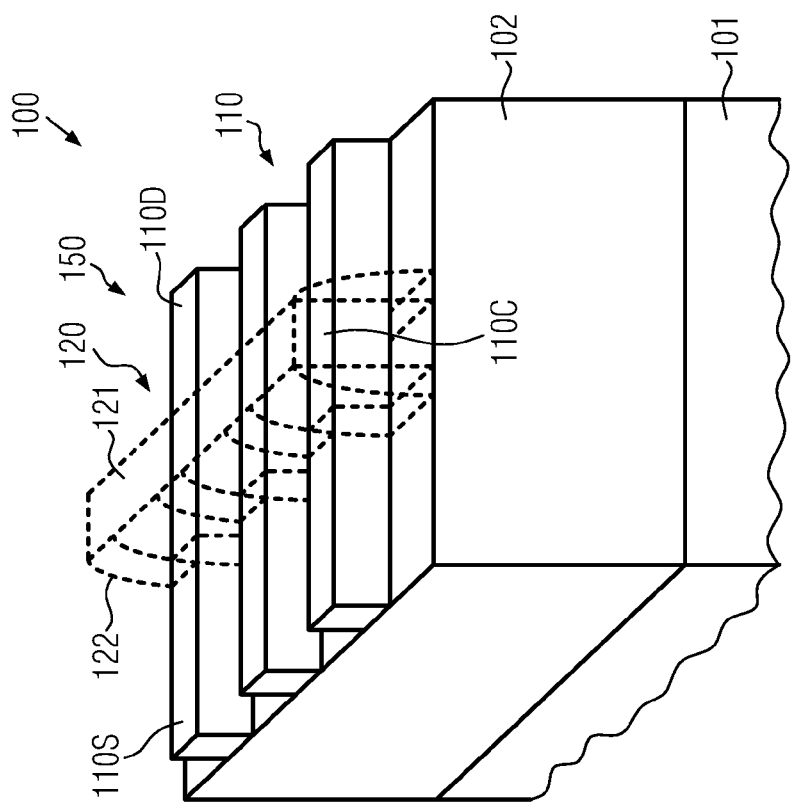
Figure 1D:
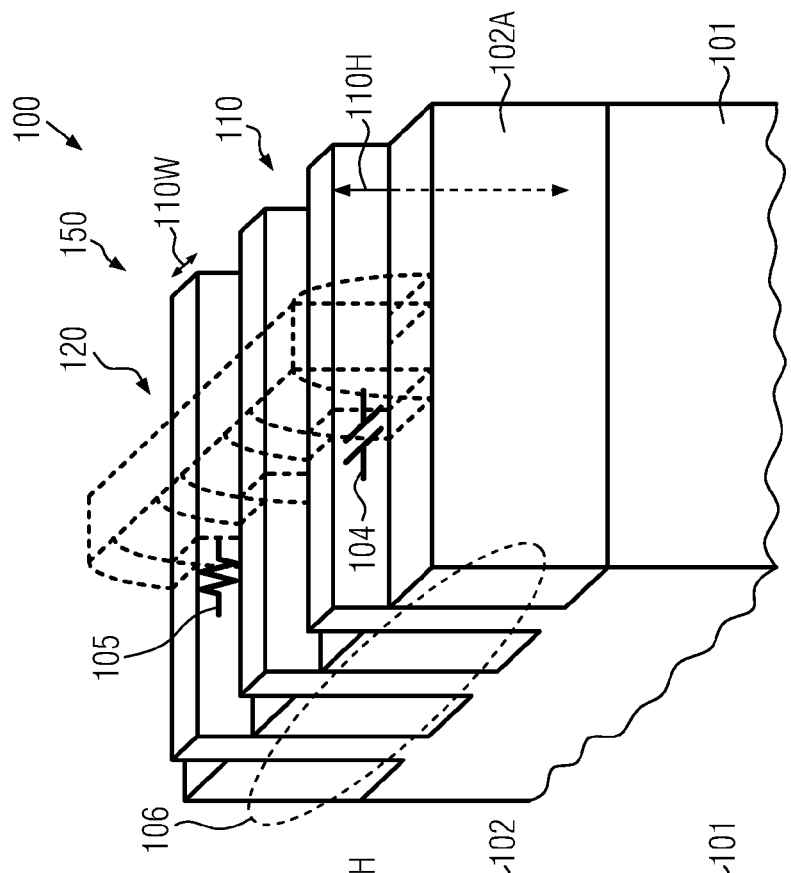

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides semiconductor devices and manufacturing techniques in which three-dimensional transistors, possibly in combination with planar transistors, may be efficiently formed on the basis of a bulk configuration, while at the same time self-aligned semiconductor fins and thus continuous drain and source regions may be provided so as to obtain superior conductivity of the resulting three-dimensional transistor. The self-aligned nature of the semiconductor fins may be obtained on the basis of a process flow in which a portion of the gate electrode structure, i.e., a gate dielectric material and an electrode material or a placeholder material, may be provided on the basis of a mask layer having an appropriate gate opening for defining the lateral size and position of a gate electrode. Based on the gate opening, the semiconductor fins may be formed within the gate opening for three-dimensional transistors, while any planar transistors may be formed on the basis of the semiconductor material without being patterned through the corresponding gate opening. Furthermore, a dielectric material for isolating the semiconductor fins within the gate opening may be formed independently from the provision of an appropriate trench isolation structure, thereby enabling an efficient tuning of the electronic characteristics of the semiconductor fins, for instance by adjusting the effective height of the semiconductor fins, thereby contributing to a high degree of flexibility in adjusting the transistor characteristics without influencing, for instance, any planar transistors. Furthermore, since the gate electrode structures of the three-dimensional transistors and of planar transistors may be formed in a common process sequence, the further processing may be based on processes and materials which may be used for the three-dimensional architecture and the planar transistor architecture so that well-established mechanisms, such as strain-inducing mechanisms, raised drain and source regions, recessed drain and source regions, high-k metal gate electrode structures and the like, may be efficiently applied to both transistor architectures.

With reference to FIGS. 2a-2x and 3a-3d, further illustrative embodiments will now be described in more detail, wherein reference is also made to FIG. 2, which may illustrate a basic configuration of a self-aligned three-dimensional transistor in bulk architecture. Moreover, reference may also be made to FIGS. 1a-1d, if appropriate.

Figure 2:
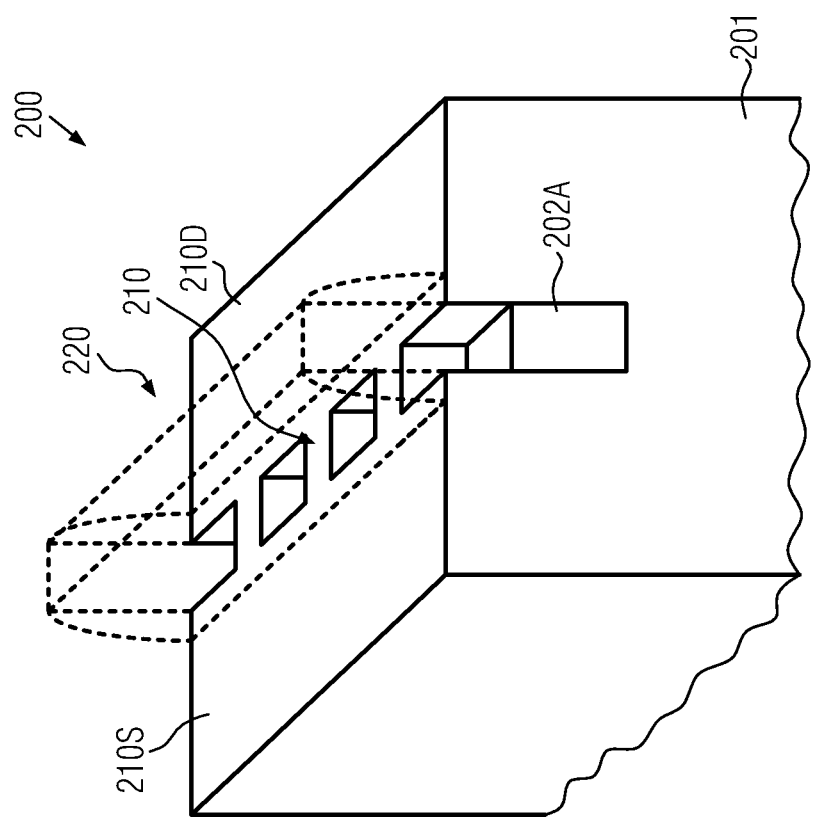
FIG. 2 schematically illustrates a perspective view of a semiconductor device comprising a FinFET transistor formed on the basis of a bulk configuration comprising self-aligned semiconductor fins.

FIG. 2 schematically illustrates a perspective view of a semiconductor device 200 comprising a substrate 201, which may be understood as any appropriate carrier material having formed thereon a crystalline semiconductor material, such as a silicon material whose thickness is greater than a depth of any well region of transistors to be formed in and above the substrate 201. Therefore, it should be appreciated that the device 200 may be considered as a bulk configuration, even if any insulating material may be provided in the "depth" of the substrate 201, as long as a crystalline portion of the substrate 201 may have a sufficient thickness so as to allow the formation of bulk transistors. For convenience, the corresponding initial semiconductor layer, i.e., the upper portion of the substrate 201, will also be referred to with the same reference number 201. The device 200 may further comprise a drain region 210D and a source region 210S formed in the semiconductor layer 201, wherein a plurality of fins 210 may extend between the drain and source regions 210D, 210S with a length that is determined by a gate electrode structure 220, as will be described in more detail later on with reference to FIGS. 2a-2x. Moreover, the dimension of an active area of the semiconductor layer 201 may be defined on the basis of an isolation structure (not shown), such as a shallow trench isolation, as will also be described later on in more detail. Additionally, a dielectric material 202A may be provided below the gate electrode structure 220 and between the semiconductor fins 210, wherein the dielectric material 202A may thus define an electrically effective height of the semiconductor fins 210, as will also be described later on in more detail. The basic self-aligned configuration of the device 200 may be obtained on the basis of process techniques as will be described with reference to FIGS. 2a-2x and 3a-3d.

Figure 2A:
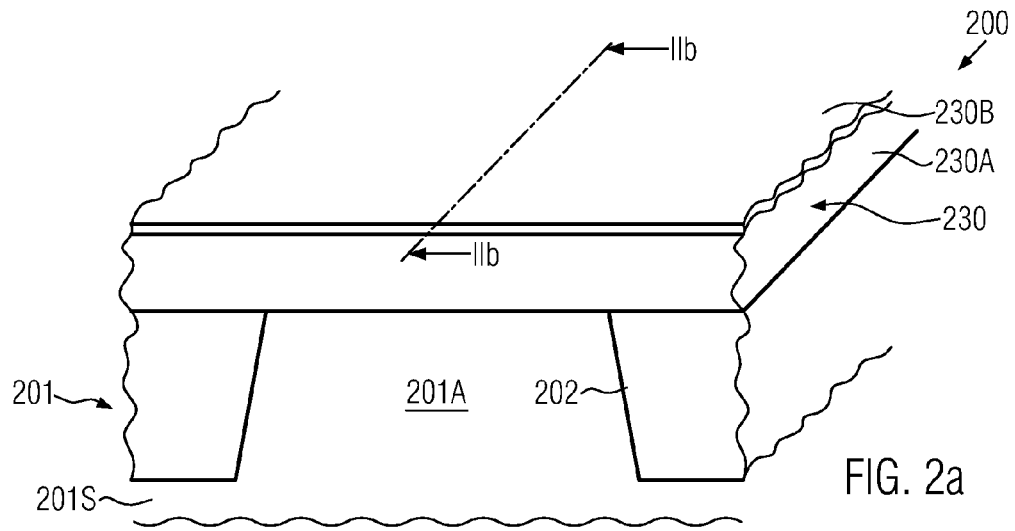
FIG. 2a schematically illustrates a perspective view of a semiconductor device during an early manufacturing stage for forming a three-dimensional transistor, according to illustrative embodiments.

FIG. 2a schematically illustrates a perspective view of the semiconductor device 200 in an early manufacturing stage according to illustrative embodiments. As illustrated, an isolation structure, such as a shallow trench isolation 202, may be formed in the substrate 201, thereby laterally delineating an active region or semiconductor region 201A, or any other active regions, in which three-dimensional transistors, possibly in combination with planar transistors, are to be formed. The isolation structure 202 may extend to a desired depth into a deeper portion of the substrate 201, as indicated by 201S. Furthermore, the device 200 may comprise a mask layer 230 made of any appropriate material, such as silicon nitride and the like, wherein a thickness of the mask layer 230 may be appropriately selected so as to correspond to the target height level of gate electrode structures to be formed on the basis of the mask layer 230. It should be appreciated that the mask layer 230 may comprise two or more individual sub-layers for providing etch stop capabilities, chemical mechanical polishing (CMP) stop capabilities, hard mask capabilities, for instance for forming a second mask material in a later manufacturing stage, and the like. In the embodiment shown, the mask layer 230 may comprise a first sub-layer 230A, for instance in the form of a silicon nitride material, followed by a second sub-layer 230B, which may provide superior etch stop and CMP stop capabilities in a later manufacturing stage. For example, the layer 230B may comprise a metal species, such as platinum, in combination with silicon material, thereby forming, for instance, a platinum silicide material, which may provide high temperature stability and may have desired etch stop and CMP stop capabilities. For example, a thickness of the layer 230B may be in the range of approximately 5-20 nm, while any other thickness values may also be selected depending on the overall material characteristics of the layer 230B.

The device 200 as illustrated in FIG. 2a may be formed on the basis of the following processes. The active region 210A, in combination with any other active regions, may be formed by providing the isolation structure 202 by using well-established STI processes, for instance based on lithography, etch techniques, deposition techniques, planarization techniques and the like. That is, after forming appropriate trenches and filling the same with appropriate dielectric material, any excess material may be removed, in combination with sacrificial material layers, such as hard mask materials and the like, which may be accomplished by performing well-established CMP processes. Consequently, the semiconductor material of the active region 201A and the isolation structure 202 may extend to substantially the same height level. Prior to or after forming the isolation structure 202, any dopant species may be incorporated into the active region 201A in accordance with well-established masking regimes and implantation techniques. Also, any well isolation implants may be introduced into the substrate material 201S in order to vertically isolate the active region 201A from deeper areas, i.e., the material 201S. Thereafter, the mask layer 230 may be formed, for instance, by depositing the sub-layer 230A using well-established chemical vapor deposition (CVD) techniques for forming an appropriate material, such as silicon nitride, wherein, as previously explained, prior to the deposition of the layer 230A, an additional mask layer (not shown) may be provided, for instance in the form of a silicon dioxide material. Next, if required, the optional stop layer 230B may be formed, for instance by depositing a silicon material and forming a platinum material thereon, wherein chemical reaction may be initiated on the basis of a heat treatment so as to form a platinum silicide material, which may be accomplished on the basis of well-established silicidation techniques. It should be appreciated that any other material composition for the layer 230B may be used, as long as the desired etch stop and CMP stop capabilities may be achieved. In other cases, the stop capabilities of the layer 230A may be considered appropriate for the further processing.

Figure 2B:
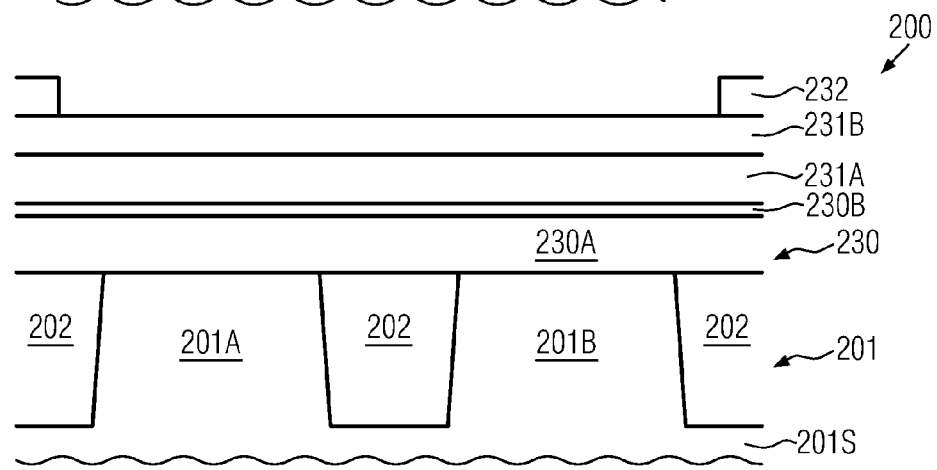
FIGS. 2b-2c schematically illustrate cross-sectional views, according to the section IIb in FIG. 2a, in further advanced manufacturing stages for forming self-aligned semiconductor fins within a gate opening, according to illustrative embodiments.

FIG. 2b schematically illustrates the device 200 in a cross-sectional view taken along the section IIb as shown in FIG. 2a. In the manufacturing stage shown, an etch mask 232 may be provided above the mask layer 230, wherein additional materials, such as an optical planarization layer 231A and an anti-reflective coating (ARC) layer 231B may be provided for patterning the mask layer 230. Furthermore, a further active region 201B may be formed in the semiconductor layer 201 on the basis of the shallow trench isolation 202 and may represent, for instance, an active region having an inverse doping compared to the active region 201A so that complementary transistors may be formed in and above the active regions 201A, 201B.

The device 200 as illustrated in FIG. 2b may be formed on the basis of well-established process techniques for applying the materials 201A, 201B and forming the resist mask 232. It should be appreciated that any process recipes may be used as are typically established for providing trenches of lateral dimensions in material systems, such as in semiconductor materials, for instance in the form of isolation trenches, in metallization systems, in contact levels and the like. After patterning the layers 231A, 231B, the optional stop layer 230B may be opened, for instance on the basis of plasma assisted etch recipes or wet chemical chemistries, followed by an anisotropic etch process based on a $CH_3F$ chemistry, in which silicon nitride may be efficiently etched selectively with respect to silicon dioxide and silicon material.

Figure 2C:
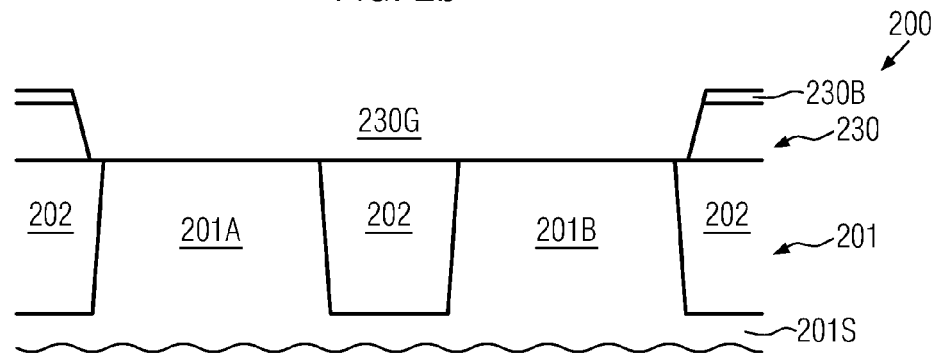

FIG. 2c schematically illustrates the semiconductor device 200 after the above-described etch process and after the removal of any sacrificial materials, such as the resist mask 232 and the materials 231A, 231B (FIG. 2b). Thus, a gate opening 230G may be formed above the active regions 201A, 201B and above a corresponding portion of the shallow trench isolation 202. In the embodiment shown, it may be assumed that the gate opening 230G may expose a surface portion of the active regions 201A, 201B, except for any contaminations or oxide residues and the like. In other illustrative embodiments (not shown), the etch process for forming the gate opening 230G may be stopped on an additional etch stop layer or mask layer, such as a silicon dioxide material, which may be provided within the mask layer 230, if desired. A corresponding additional mask layer may be used during the further processing or may be removed so as to expose the active regions 201A, 201B.

Figure 1C:
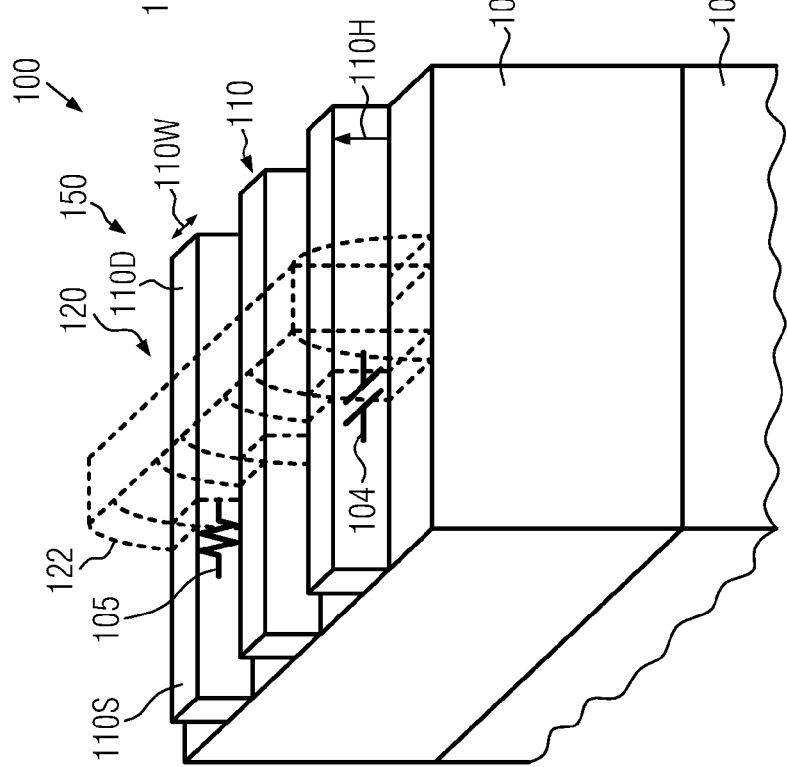
Figure 2D:
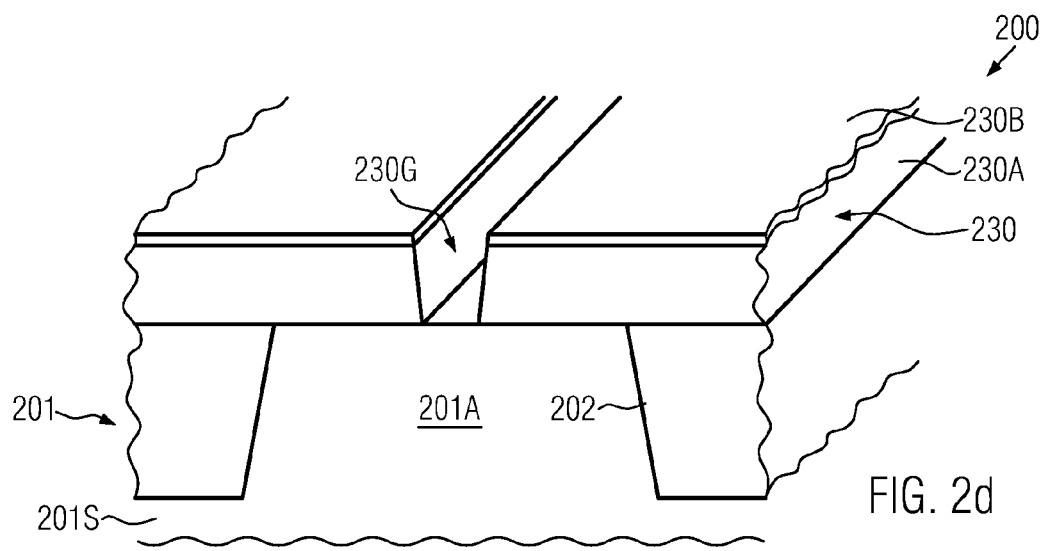
FIGS. 2d-2f schematically illustrate perspective views of the semiconductor device during various manufacturing stages, according to illustrative embodiments.

FIG. 2d schematically illustrates a perspective view of the device 200 in a manufacturing stage as is also illustrated in FIG. 1c. For convenience, the gate opening 230G is illustrated so as to extend across the active region 201A in order to simplify the illustration. It should be appreciated, however, that the gate opening 230G may also extend across a subsequent active region when a direct connection of the corresponding gate electrode structures for these adjacent active regions is required, as is, for instance, illustrated in FIG. 2d.

Consequently, based on the gate opening 230G, the semiconductor layer 201 of the active region 201A may be patterned so as to form self-aligned semiconductor fins therein, while, in other gate openings, a corresponding patterning of the active region may be avoided when planar transistor configuration is to be formed in and above the corresponding semiconductor regions.

Figure 2E:
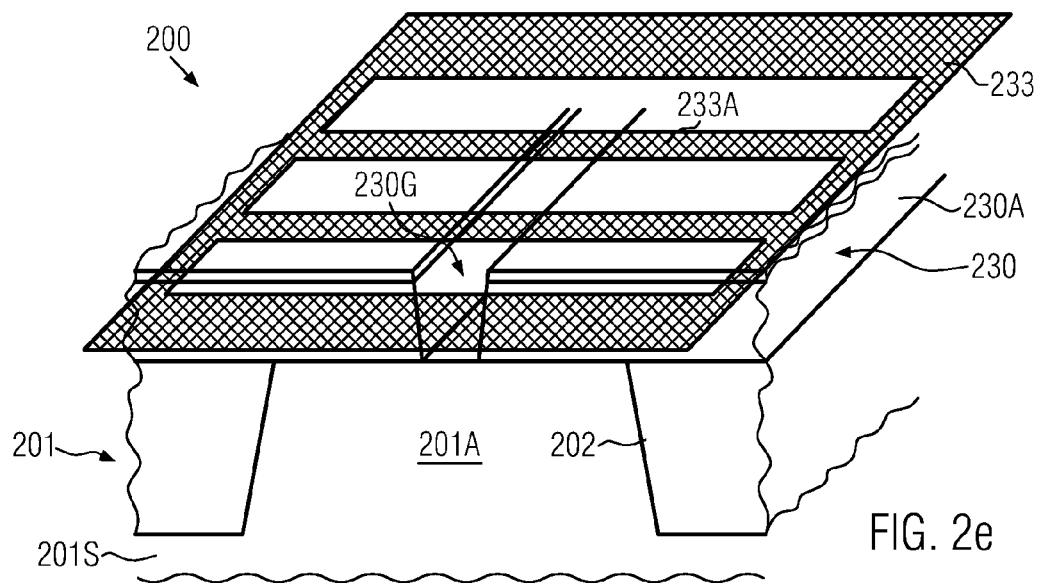

FIG. 2e schematically illustrates a perspective view of the device 200 in a further advanced manufacturing stage according to some illustrative embodiments. As illustrated, a further mask layer 233, for instance in the form of a silicon dioxide material, may be formed above the mask layer 230 and within the gate opening 230G, wherein a plurality of mask features 233A may be provided, for instance in the form of lines which may substantially define the lateral position and size of semiconductor fins to be formed in the active region 201A in a self-aligned manner with respect to the gate opening 230G. In other illustrative embodiments, as previously discussed, a further mask layer 233 may be provided in the form of a sub-layer of the mask 230, for instance in the form of a silicon dioxide layer, which may be used as an etch stop material upon forming the gate opening 230G and which may be subsequently patterned so as to form the mask features 233A within the gate opening 230G.

Figure 2F:
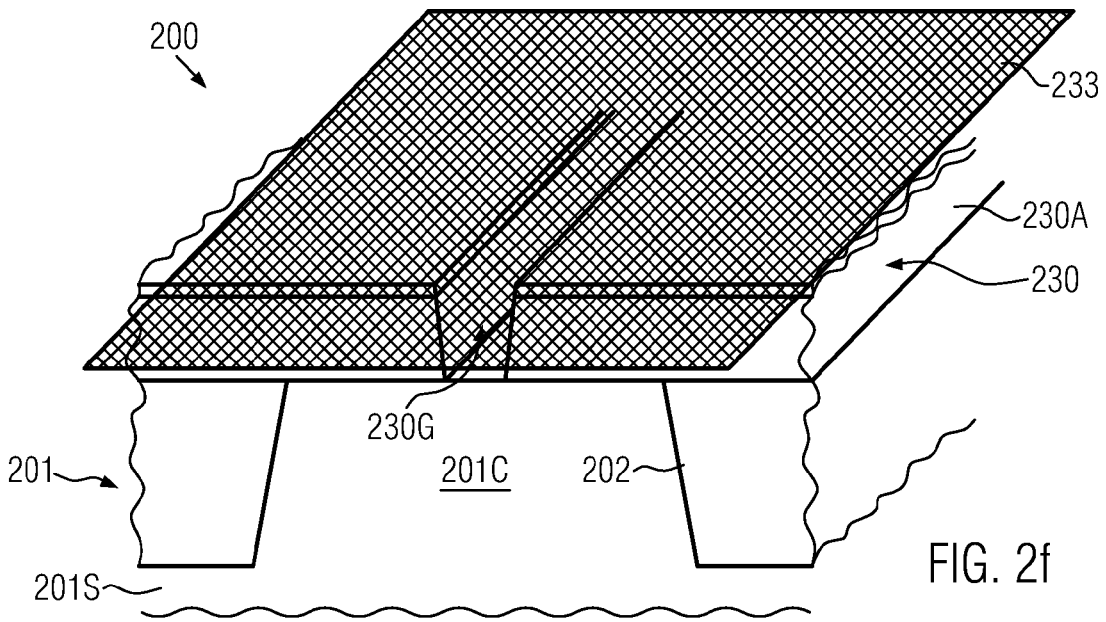

FIG. 2f schematically illustrates a portion of the device 200 comprising an active region 201C, in and above which a planar transistor may be provided on the basis of the gate opening 230G. Consequently, in this case, the mask layer 233 may be provided without any mask features within the gate opening 230G, thereby avoiding a patterning of the active region 201C during the subsequent processes.

Figure 2G:
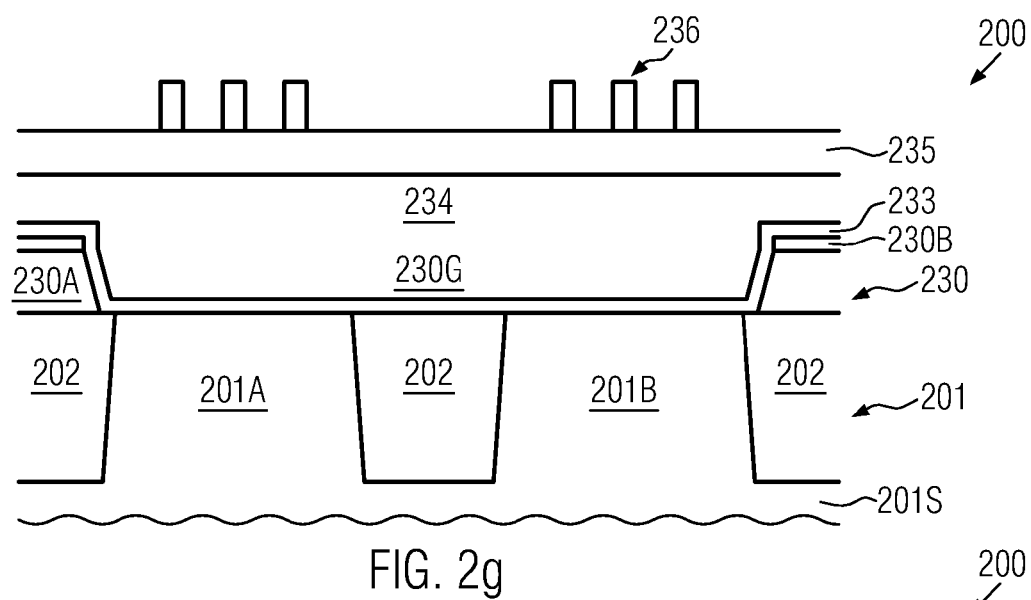
FIGS. 2g-2h schematically illustrate cross-sectional views along the section IIb of FIG. 2a during further advanced manufacturing stages, according to illustrative embodiments.

FIG. 2g schematically illustrates a cross-sectional view along the section IIb as shown in FIG. 2a in a manufacturing stage prior to patterning the further mask layer 233. As illustrated, an optical planarization layer 234 in combination with an ARC layer 235 may be provided so as to form a resist mask 236, which may be used for patterning the mask layer 233.

The device 200 as illustrated in FIG. 2g may be formed on the basis of the following processes. The mask layer 233 may be formed above the mask layer 230 on the basis of appropriate deposition techniques, such as CVD of silicon dioxide material, while, in other embodiments, the layer 233 may be provided as a part of the mask layer 230 and may thus be exposed within the gate opening 230G upon patterning the layers 230B and 230A of the mask layer 230. Thereafter, the sacrificial materials 234 and 235 may be provided on the basis of well-established process techniques, followed by the application of a resist material and patterning the same in order to obtain the resist mask 236. It should be appreciated that forming an opening in the bottom of a trench may frequently be applied, for instance, in forming complex metallization systems on the basis of a dual damascene process strategy. Consequently, any such well-established process recipes may be used and appropriately modified in order to pattern the mask layer 233 at the bottom of the gate opening 230G. Consequently, upon applying well-established process strategies, the mask layer 233 may be patterned, thereby exposing corresponding areas in the active regions 201A, 201B, which may represent respective "spaces" between semiconductor fins. For example, the corresponding spaces may be considered as "vias" in a process sequence that may correspond to a trench first/via last approach, which may frequently be applied in forming metal lines and vias in complex metallization systems.

Figure 2H:
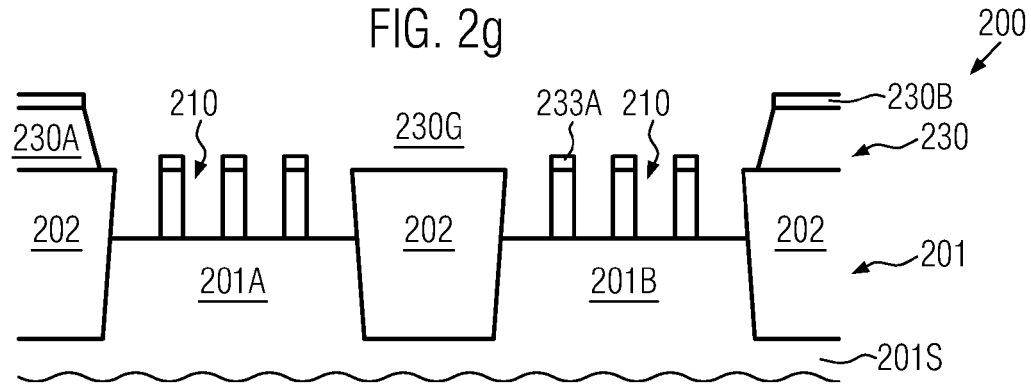

FIG. 2h schematically illustrates the semiconductor device 200 in a further advanced manufacturing stage. As illustrated, based on the mask layer 233 (FIG. 2g), having the mask regions 233A, an appropriate etch process may be performed, for instance on the basis of hydrogen bromide-based etch recipes, in order to form corresponding fins 210, the lateral size and position of which may be defined by the mask features 233A. The height of the semiconductor fins 210 may be determined on the basis of a time-controlled etch process, while, in other cases, appropriate species may be incorporated into the active regions 201A, 201B, for instance on the basis of ion implantation and the like. The implantation species may be used as an appropriate etch control or etch stop material. It should be appreciated that appropriate etch recipes may be established on the basis of etch techniques, which are also frequently used in sophisticated planar transistor configurations, for instance by forming cavities in the active region of the planar transistor in order to incorporate a strain-inducing semiconductor material, as will also be described later on in more detail with respect to FIGS. 3a-3b.

Figure 2I:
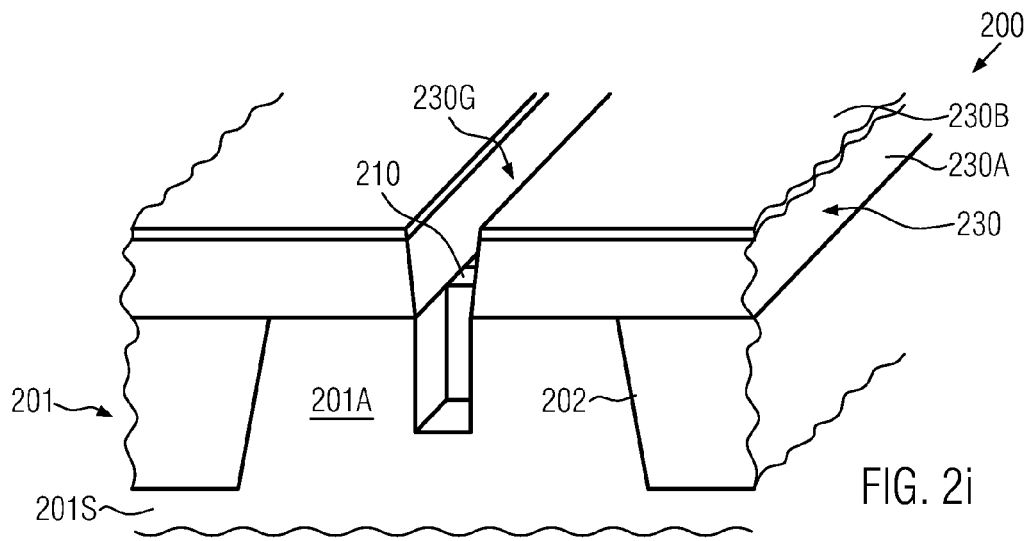
FIGS. 2i-2l schematically illustrate perspective views of the semiconductor device in further advanced manufacturing stages, according to illustrative embodiments.

FIG. 2i schematically illustrates the device 200 after the above-described process sequence and after the removal of the mask layer 233 (FIG. 2g) or at least an exposed portion thereof, i.e., of the mask features 233A (FIG. 2h). As illustrated, the fins 210 are formed in a self-aligned manner within the active region 201A, and also within any other active regions requiring a three-dimensional transistor configuration, wherein the length of the fins 210 is determined by the width of the gate opening 230G. Furthermore, corresponding spaces or "vias" are provided between the semiconductor fins 210, which may extend into the depth of the active region 201A, in accordance with device requirements.

Figure 2J:
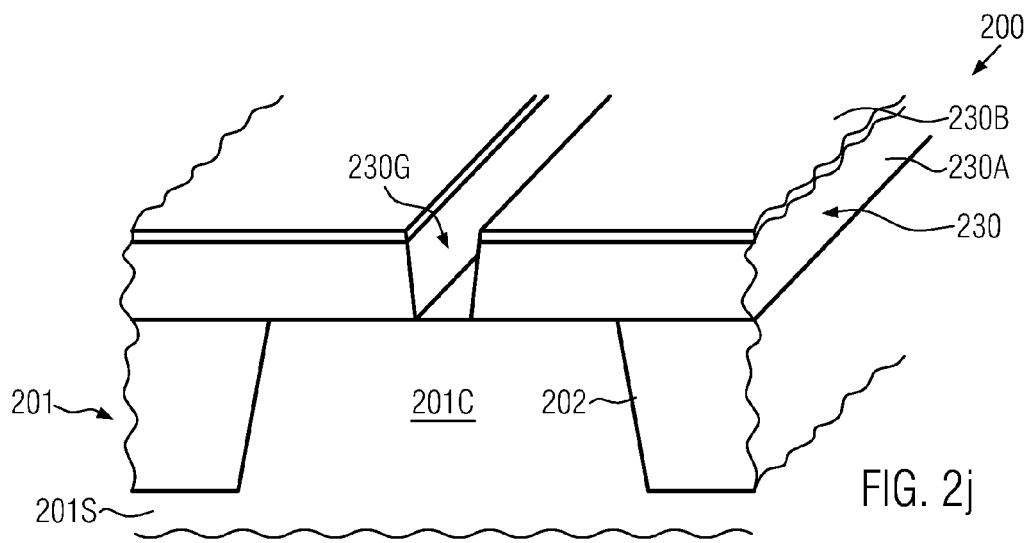

FIG. 2j schematically illustrates the device 200 with the gate opening 230G formed above the active region 201C, which may remain unpatterned since the mask 233 (FIG. 2g) may not be patterned in this area of the device 200, thereby providing a planar configuration of the active region 201C for forming planar transistors during the further processing of the device 200.

Figure 2K:
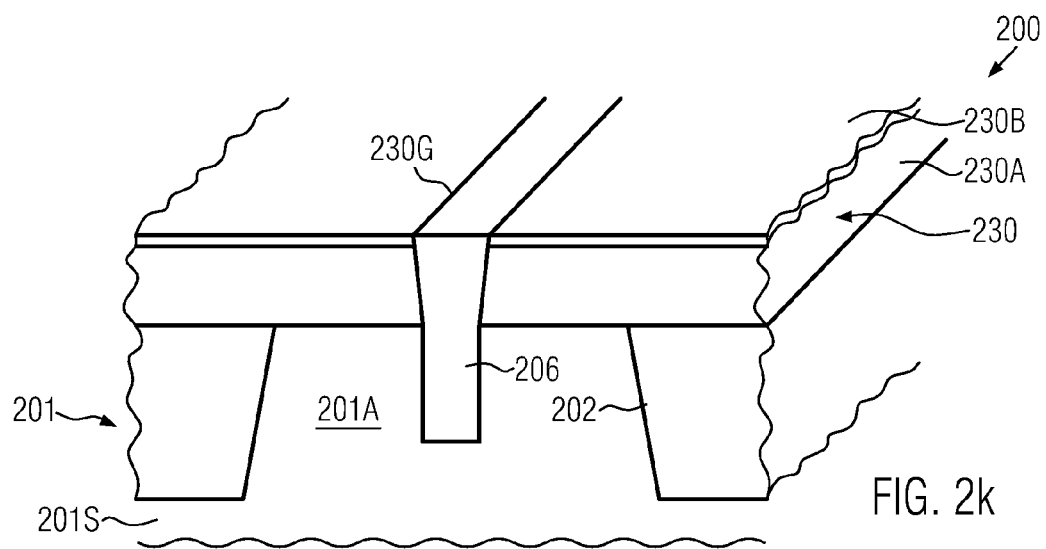

FIG. 2k schematically illustrates the device 200 in a further advanced manufacturing stage. As shown, a dielectric material 206, such as an oxide material and the like, may be formed in the gate opening 230G so as to reliably fill the spaces or vias formed between the semiconductor fins 210 (FIG. 2i).

Figure 2L:
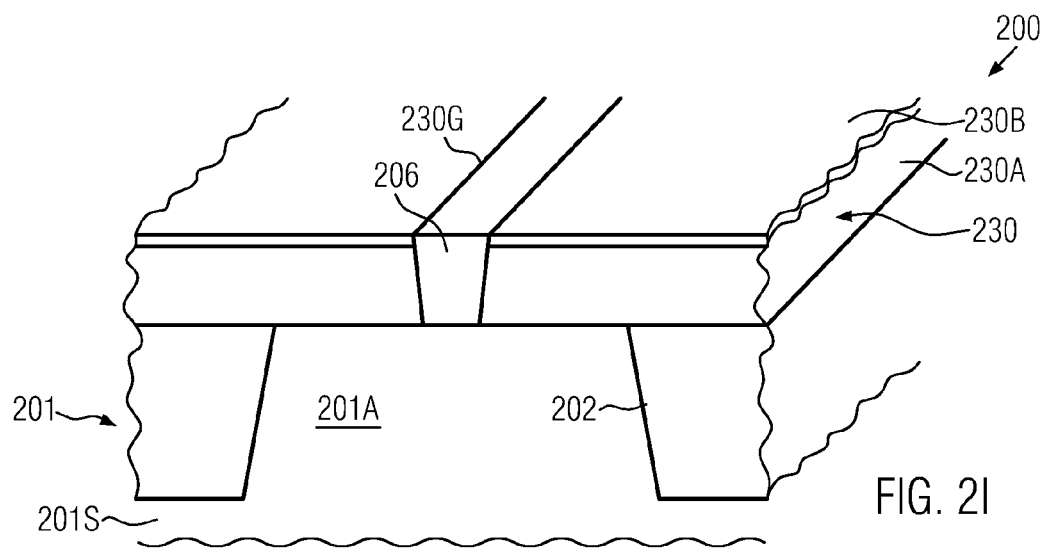

FIG. 2l schematically illustrates the device 200 wherein the dielectric material 206 may be continuously provided within the gate opening 230G, which does not comprise any semiconductor fins, as previously explained.

Figure 2M:
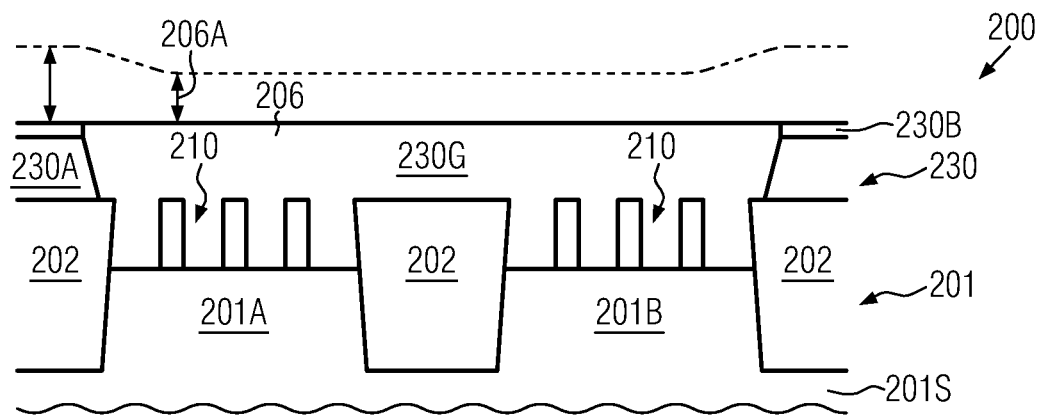
FIGS. 2m-2n schematically illustrate cross-sectional views along the section IIb of FIG. 2a, according to illustrative embodiments.

FIG. 2m schematically illustrates a cross-sectional view of the device 200 in a manufacturing stage in which the dielectric material 206 may be formed so as to fill the gate opening 230G, which may be accomplished on the basis of any appropriate deposition technique providing the desired gap fill capabilities. For example, silicon dioxide material, for instance based on TEOS (tetra ethyl ortho silicate), may be provided by CVD-based techniques with superior fill characteristics, thereby substantially avoiding any undue deposition-related irregularities, such as voids and the like. After the deposition of the dielectric material 206, a certain surface topography may be created, due to the gate opening 230G, so that a certain degree of excess material 206A may be provided so as to enable an efficient planarization process in order to obtain a planar surface of the dielectric material 206. For this purpose, CMP processes may be applied, wherein well-established recipes are available for removing silicon dioxide material, for instance, selectively with respect to silicon nitride, while, in the embodiment shown, the optional layer 230B may provide superior CMP stop capabilities. Consequently, the excess portion 206A may be removed with high uniformity and in a well-controllable manner on the basis of established CMP techniques by using the mask material 230 as an efficient stop material. Due to the high selectivity of the corresponding process, the height level of the dielectric material 206 may be provided with a high degree of uniformity across the entire device 200, which may thus result in highly uniform transistor characteristics, since the dielectric material 206 may be used for adjusting the effective height of the semiconductor fins 210 in a subsequent etch process.

Figure 2N:
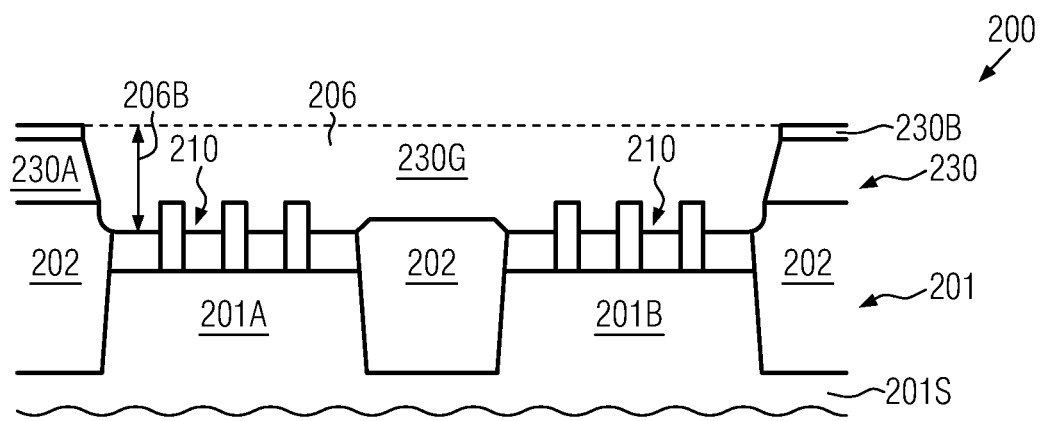

FIG. 2n schematically illustrates the semiconductor device 200 in a further advanced manufacturing stage. As illustrated, a further excess portion 206B of the material 206 may be removed, for instance on the basis of diluted hydrofluoric acid or atomic layer etch process recipes, thereby removing the excess portion 206B in a highly controlled manner and with a high degree of uniformity. Consequently, a desired height level of the dielectric material 206 may be adjusted during the corresponding well-controllable etch process, thereby also exposing a well-defined portion of the semiconductor fins 210. That is, since the initial height level of the dielectric material 206 (FIG. 2m) may be defined on the basis of the very uniformly provided mask material 230, substantially without introducing significant process non-uniformities during the removal of the excess portion 206A, the final height level of the material 206 after the removal of the portion 206B may also be adjusted with high precision and uniformity. Moreover, since the semiconductor fins 210 may also be patterned on the basis of well-established uniform etch techniques, as may typically be used for patterning sophisticated gate electrode structures, the height level of the semiconductor fins 210 may also be provided with a low degree of variability, so that the electrically effective height of the semiconductor fins 210 may be achieved with superior control and uniformity.

It should be appreciated that the removal of the excess portion 206B may also affect exposed portions of the shallow trench isolation 202, wherein, generally, a corresponding material removal in exposed portions of the structures 202 may be reduced by, for instance, providing an appropriate etch stop material, such as a silicon nitride material, while, in other cases, upon forming the isolation structure 202, a corresponding treatment may be performed so as to incorporate nitrogen species and the like, thereby reducing the etch rate compared to the dielectric material 206. On the other hand, the height level of the shallow trench isolation 202 outside of the gate opening 230G may be greater than the height level of the material 206 and may substantially correspond to the height level of the semiconductor fins 210. Consequently, the isolation between the semiconductor fins 210 and thus the adjustment of the electrically effective height of the fins 210 may be obtained on the basis of the material 206 without being restricted by the depth of the shallow trench isolation 202.

Furthermore, when using a diluted hydrofluoric acid chemistry for removing the excess portion 206B, the optional CMP stop layer may also be removed, for instance when provided in the form of a platinum silicide material, while the remaining mask layer 230 may be preserved, for instance when provided in the form of a silicon nitride material.

Figure 2O:
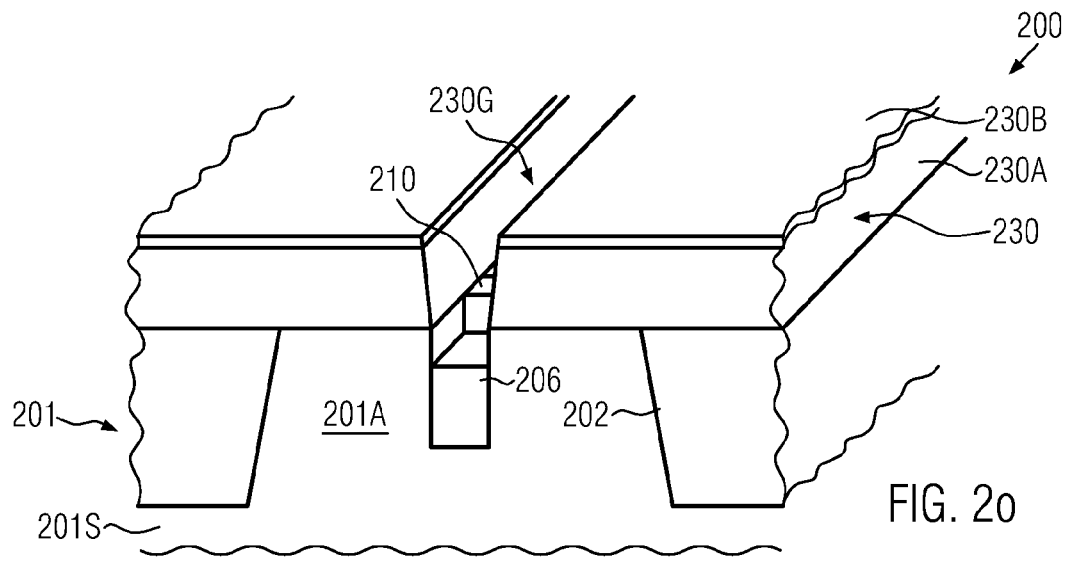
FIGS. 2o-2r schematically illustrate perspective views of the semiconductor device during further advanced manufacturing stages, according to illustrative embodiments.

FIG. 2o schematically illustrates the device 200 in a perspective view after the above-described process sequence. As illustrated, the dielectric material 206 may be provided between the semiconductor fins 210 and may expose a desired upper portion of the fins 210 in accordance with device requirements.

Figure 2P:
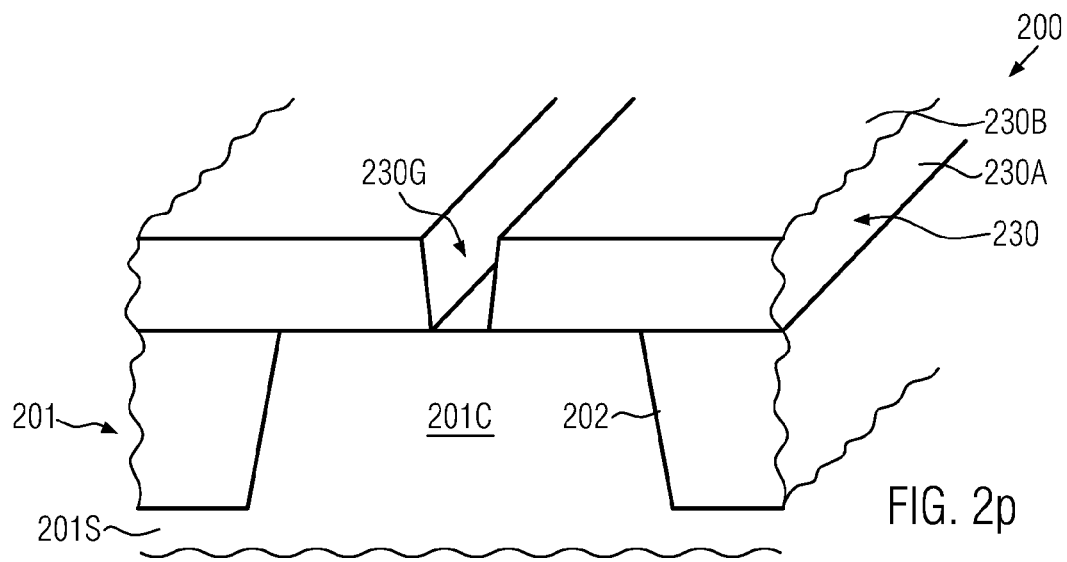

FIG. 2p schematically illustrates the device 200 with respect to the active region 201C, wherein dielectric material 206 (FIG. 2o) is completely removed from within the gate opening 230G, while the high selectivity of the corresponding etch process, for instance performed on the basis of diluted HF, may substantially not affect the portion of the active region 201C exposed by the gate opening 230G. Consequently, a planar transistor may be efficiently formed on the basis of the gate opening 230G formed above the active region 201C.

Figure 2Q:
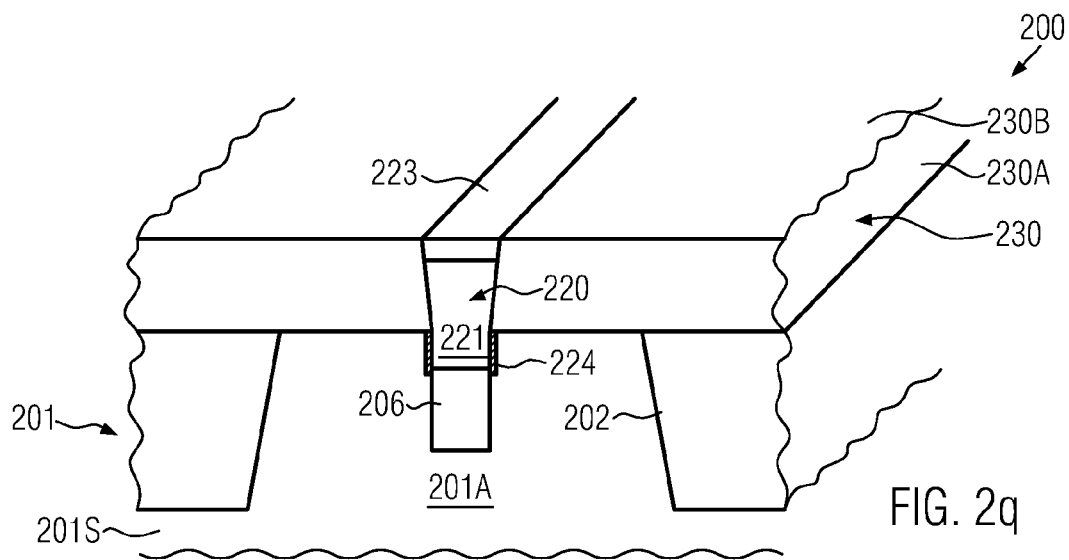

FIG. 2q schematically illustrates a perspective view of the device 200 in a further advanced manufacturing stage. As illustrated, a portion of a gate electrode structure 220, i.e., a gate dielectric material 224 and an electrode material 221 in combination with a dielectric cap material 223 may be formed in the gate opening of the mask layer 230, thereby enclosing, thus contacting, the semiconductor fins (not shown) formed in the gate opening. As illustrated, the gate dielectric material 224 may also be formed on both sidewall areas of the active region 201A adjacent to the dielectric material 206.

Figure 2R:
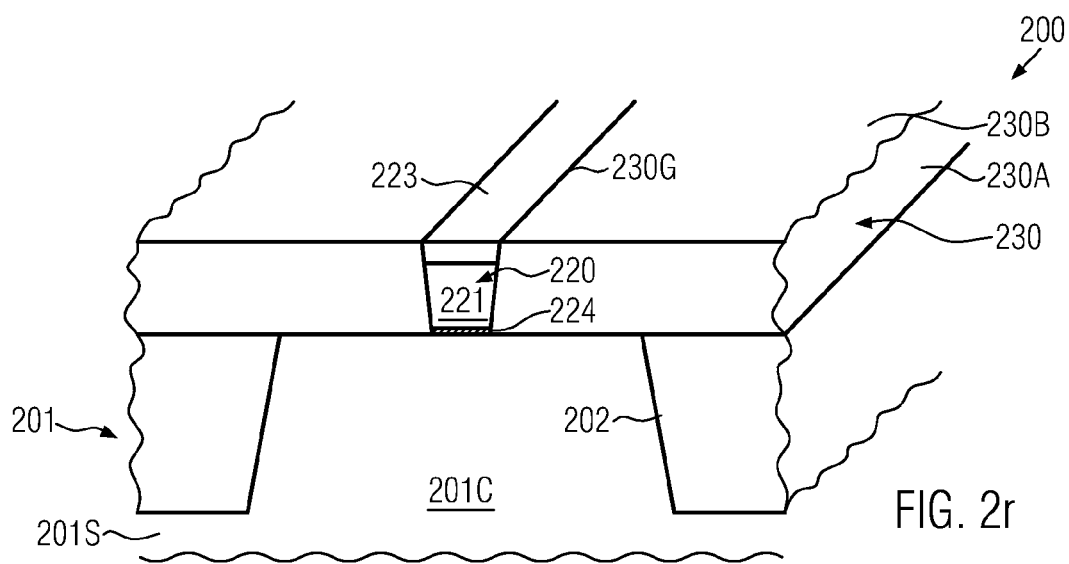

FIG. 2r schematically illustrates the device 200 with respect to the planar transistor configuration. Thus, the gate electrode structure 220 may comprise a gate dielectric material 224 in a planar configuration formed on the exposed portion of the active region 201C, i.e., at the bottom of the gate opening 230G. It should be appreciated that the gate dielectric material 224 may be provided on the basis of sophisticated oxidation techniques and additional surface treatments so as to provide the dielectric material 224 on exposed surface areas of the active regions and the semiconductor fins, as for instance shown in FIGS. 2q and 2r. In other cases, sophisticated deposition techniques may be applied, in which case the dielectric material 224 may also be formed on any exposed surface area within the gate opening 230G and also above the mask layer 230 outside of the gate openings 230G.

Figure 2S:
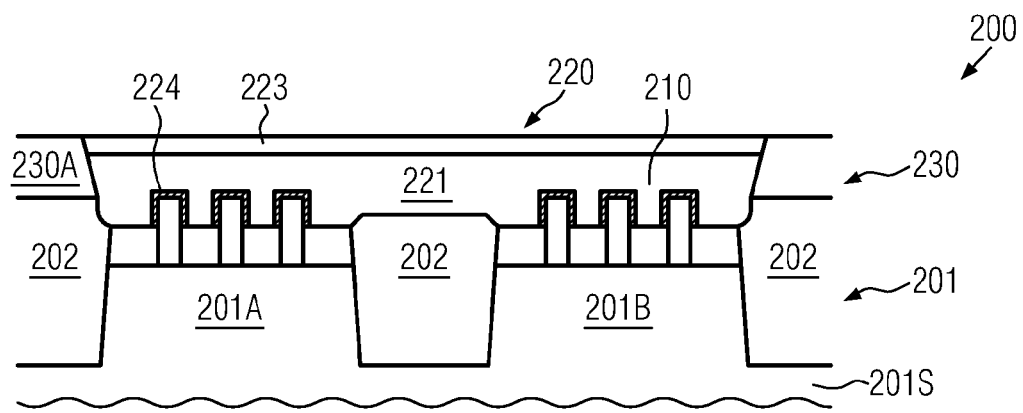
FIGS. 2s-2t schematically illustrate cross-sectional views along the line IIb shown in FIG. 2a during various manufacturing stages.

FIG. 2s schematically illustrates a cross-sectional view of the device 200 according to a manufacturing stage as is also shown in FIGS. 2q and 2r. As illustrated, the gate dielectric material 224 may be formed on any exposed surface areas of the semiconductor fins 210, for instance on the exposed portions of the sidewall areas and on a top surface of the semiconductor fins 210, thereby providing a tri-gate configuration. Furthermore, the electrode material 221, for instance in the form of a polysilicon material, may be deposited on the basis of well-established deposition techniques. Thereafter, any excess material may be removed, for instance by CMP, and the material 221 may be oxidized if a hard mask material, such as the cap layer 223, is required for the further processing.

Figure 2T:
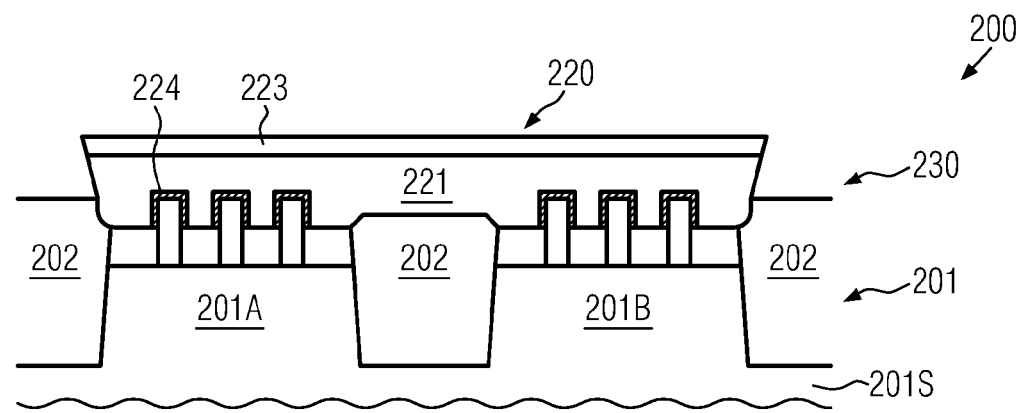

FIG. 2t schematically illustrates the semiconductor device 200 in a further advanced manufacturing stage in which the mask material 230 (FIG. 2s) may be removed, for instance, on the basis of hot phosphoric acid and the like. During this etch process, integrity of the electrode material 221 may be preserved by means of the cap layer 223, if the selectivity of the material 221 is considered insufficient for removing the mask material 230.

Figure 2U:
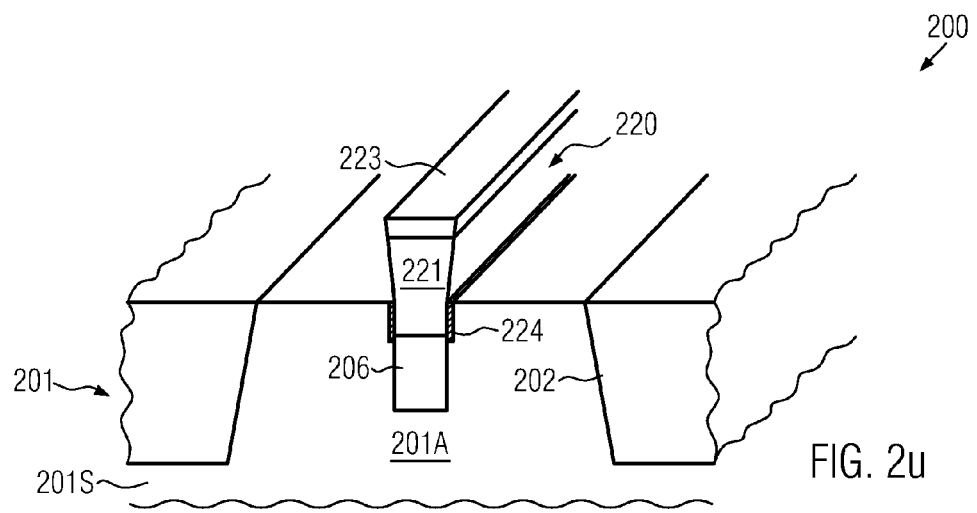
FIGS. 2u-2x schematically illustrate perspective views of a three-dimensional transistor and a planar transistor, respectively, at further advanced manufacturing stages, according to illustrative embodiments.
Figure 2V:
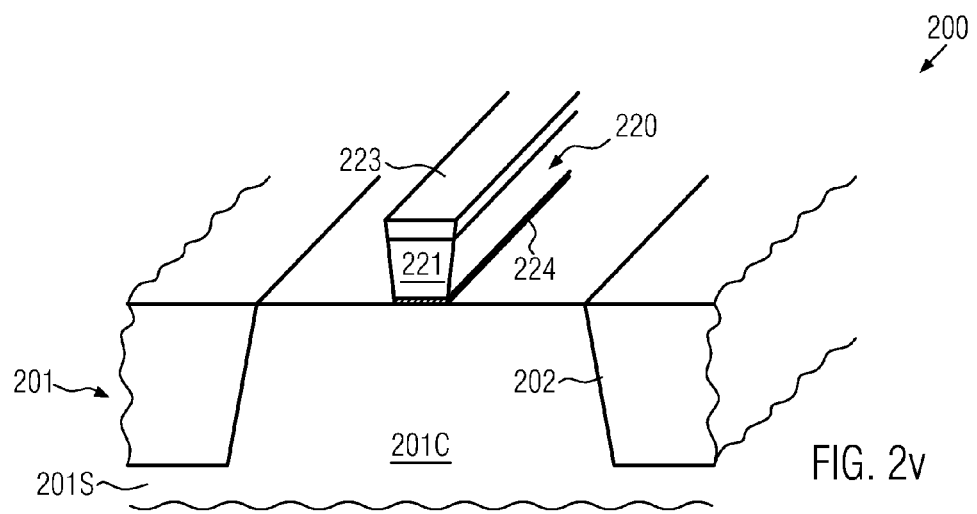

FIGS. 2u and 2v schematically illustrate perspective views of the semiconductor device 200 corresponding to the manufacturing stage as shown in FIG. 2t. As illustrated, the gate electrode structure 220 may be formed above the semiconductor fins (not shown) and above the dielectric material 206 in the active region 201A (FIG. 2u), while, for the planar transistor configuration, the gate electrode structure 220 may have an appropriate configuration, as provided above the active region 201C (FIG. 2v).

On the basis of the device configuration as shown in FIGS. 2u and 2v, the further processing may be continued on the basis of any appropriate "planar" process strategies for forming three-dimensional transistors and planar transistors, without any additional process complexity. For example, any spacer structures may be formed for the gate electrode structures 220 on the basis of well-established spacer techniques, and also the incorporation of drain and source dopant species may be performed by using well-established implantation and masking regimes. Moreover, additional mechanisms may be implemented into the three-dimensional transistor configuration and/or the planar transistor configuration by using well-established process strategies, such as embedded strain-inducing semiconductor materials, highly stressed dielectric overlayers to be provided upon completing the basic transistor configurations and the like. Moreover, as will also be described later on in more detail, sophisticated gate electrode structures including a high-k dielectric material and metal-containing electrode materials may be implemented, for instance on the basis of replacement gate approaches and the like. Similarly, any desired transistor architecture may be used, for instance, raised drain and source regions, for instance by providing epitaxially grown materials in the drain and source areas, a recessed transistor configuration, for instance by removing a desired portion of the drain and source areas, and the like.

Figure 2W:
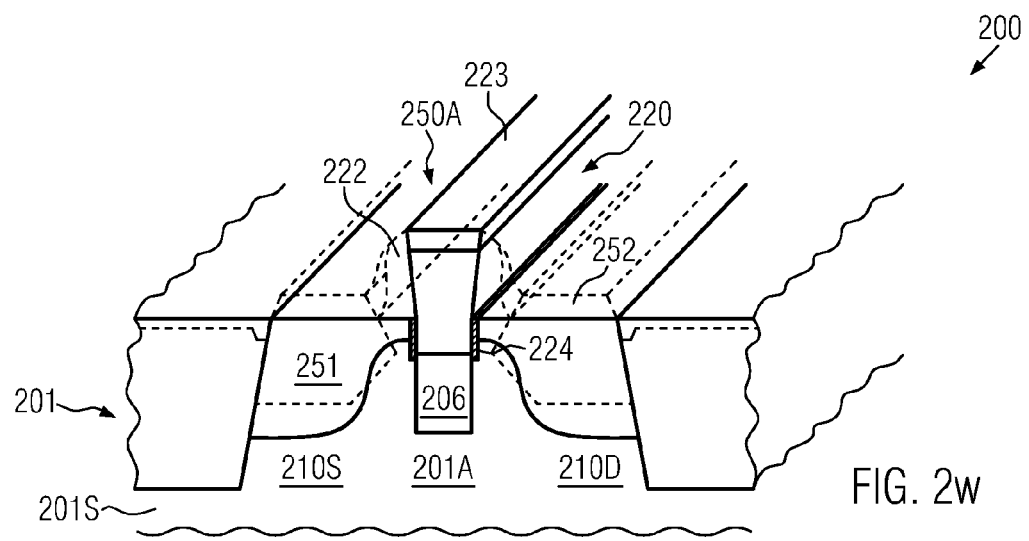

FIG. 2w schematically illustrates a perspective view of the semiconductor device 200 in a further advanced manufacturing stage. As illustrated, a three-dimensional transistor or FinFET 250A may be provided in and above the active region 201a and may comprise the gate electrode structure 220 having a configuration as previously described. Moreover, drain and source regions 210D, 210S may be formed within the active region 201A laterally adjacent to the gate electrode structure and also adjacent to the dielectric material 206. Furthermore, as shown, an embedded semiconductor material 251, such as a silicon/germanium material, a silicon/carbon material and the like, may be provided within the active region 201A, wherein, if desired, a raised drain and source configuration, as indicated by reference sign 252, may also be provided, for instance on the basis of a strain-inducing semiconductor material and the like, depending on the overall device requirements. Moreover, the gate electrode structure 220 may comprise an appropriately designed spacer structure 222 which may comprise two or more individual spacer elements, possibly in combination with etch stop materials and the like. It should be appreciated that the cap material 223 may still be present or may have been removed in an early manufacturing stage, depending on the overall process and device requirements. For example, the cap material 223 may be used as an efficient mask material for providing the embedded semiconductor material 251 in order to preserve integrity of the gate electrode structure 220, i.e., of the electrode material and the gate dielectric material, in combination with a dedicated sidewall spacer structure (not shown).

Figure 2X:
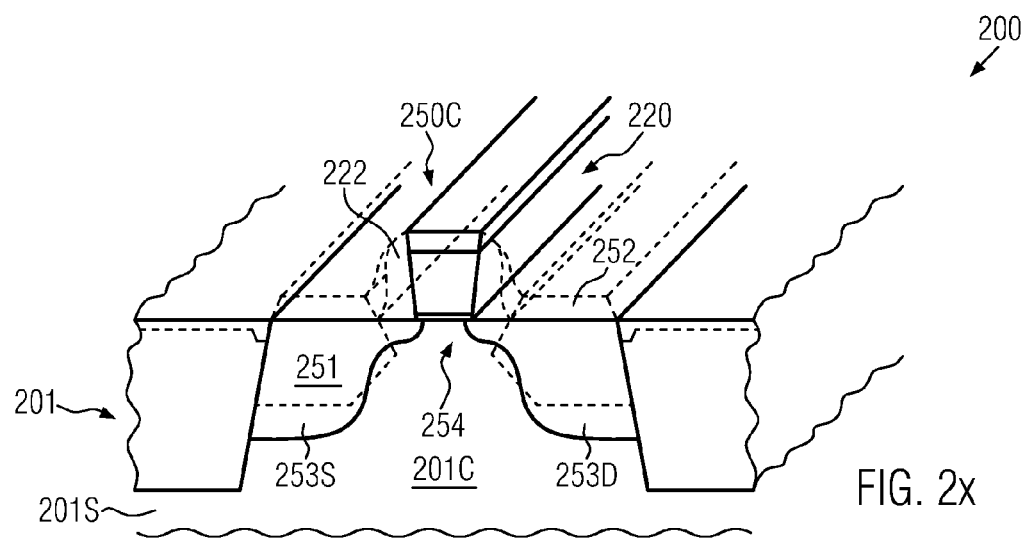

FIG. 2x schematically illustrates the device 200 with a planar transistor 250C formed in and above the active region 201C on the basis of the gate electrode structure 220, which may have basically the same configuration as the gate electrode structure 220 of the transistor 250A (FIG. 2w), except for a buried portion that is in contact with the semiconductor fins and dielectric material 206 (FIG. 2w). The transistor 250C may comprise drain and source regions 253D, 253S which may substantially correspond to the drain and source regions 210D, 210S of the transistor 250A in FIG. 2w if the same conductivity type is considered. For example, the same dopant species and profile may be provided for the transistor 250A and the transistor 250C, if complying with the target transistor characteristics. It should be appreciated, however, that, even if different dopant profiles may be required for these transistors, corresponding dopant profiles may be obtained on the basis of well-established "planar" implantation and masking techniques. Furthermore, the transistor 250C may also comprise an embedded semiconductor material 251, if required, and may have any appropriate transistor architecture, for instance in terms of raised drain and source areas, recessed drain and source areas and the like. Consequently, a planar channel region 254 may be provided in the transistor 250C on the basis of the same process sequence in which the three-dimensional transistor 250A of FIG. 2w may be fabricated.

The transistors 250A, 250C as illustrated in FIGS. 2w and 2x may be formed on the basis of any appropriate process strategy, for example by applying implantation techniques for forming extension regions of the drain and source areas, providing halo regions, i.e., counter doped regions, forming the embedded materials, such as silicon/germanium, silicon/carbon and the like, applying stress memorization techniques in some of the transistors, for instance by re-crystallizing an amorphized portion of the active regions in the presence of a rigid mask material, and the like. Similarly, appropriate anneal processes may be performed and metal silicide may be provided in the drain and source areas and in the gate electrode structures, if required. In other cases, sophisticated replacement gate approaches may be applied, as will also be described later on in more detail.

After completing the basic transistor configurations as shown in FIGS. 2w and 2x, the processing may be continued by forming a contact level, that is, by depositing one or more dielectric materials for enclosing and passivating the gate electrode structures 220 and forming appropriate contact elements therein so as to appropriately connect to a metallization system to be formed above the contact level. Also the further processing may be continued on the basis of well-established process strategies, wherein, in particular, the formation of contact elements in accordance with any desired technology may provide superior conductivity of the three-dimensional transistor 250A, since the corresponding drain and source areas may be connected in accordance with well-established processes and materials.

With reference to FIGS. 3a-3d, further variations of the above-described process flow will be explained.

Figure 3A:
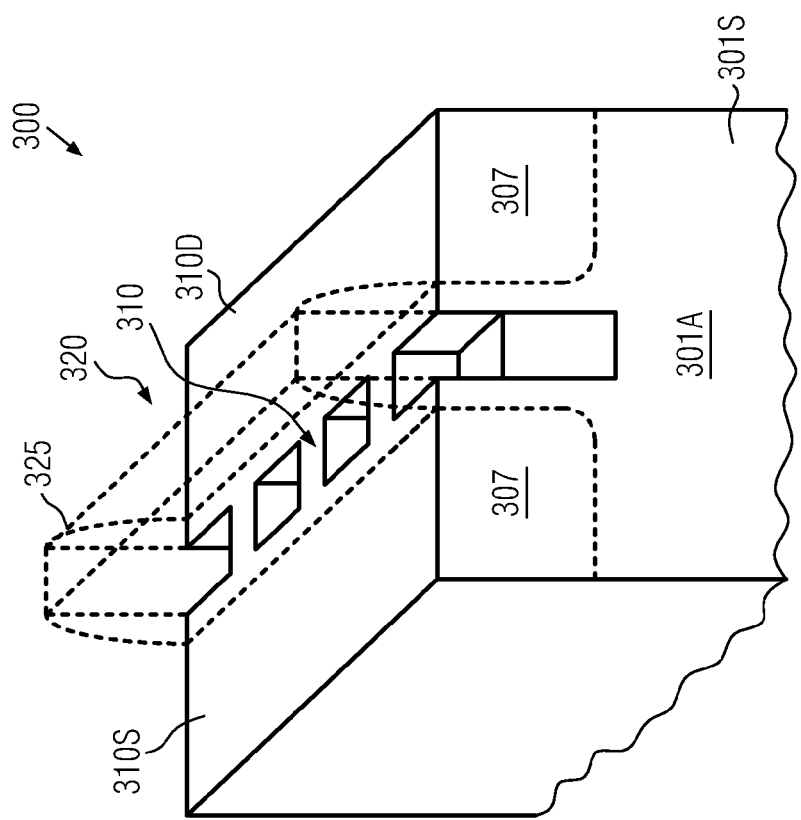
FIGS. 3a-3b schematically illustrate perspective views of a three-dimensional transistor formed on the basis of manufacturing techniques as described above, wherein an embedded strain-inducing semiconductor material may be provided, according to illustrative embodiments.

FIG. 3a schematically illustrates a perspective view of a semiconductor device 300 comprising an active region 301A formed above the crystalline material of a substrate 301S, which may comprise a drain region 310D and a source region 310S that are laterally connected by semiconductor fins 310, which are self-aligned with respect to a gate electrode structure 320, as is also previously described with reference to the semiconductor device 200. The gate electrode structure 320 may comprise an appropriate dielectric encapsulation, for instance in the form of a spacer element 325 and a cap material, such as cap material 223 as previously explained with reference, for instance, to FIG. 2q. The device 300 as illustrated in FIG. 3a may be formed on the basis of manufacturing techniques as previously described above with reference to the device 200. That is, the gate electrode structure 320, without the spacer structure 325 and the semiconductor fins 310, may be formed on the basis of a gate opening provided in a mask material and subsequently, after the removal of the mask material, the spacer structure 325 may be provided on the basis of well-established spacer techniques. In this manufacturing stage, cavities 307 may be provided in the active region 301A laterally adjacent to the gate electrode structure 320 in order to implement, for instance, a strain-inducing mechanism. To this end, any appropriate etch strategy may be applied, for instance on the basis of hydrogen bromide etch chemistries, as is also previously explained with reference to the semiconductor device 200, while other active regions may be masked by an appropriate material, for instance the spacer material from which the spacer structure 325 may be formed for the gate electrode structure 320.

Figure 3B:
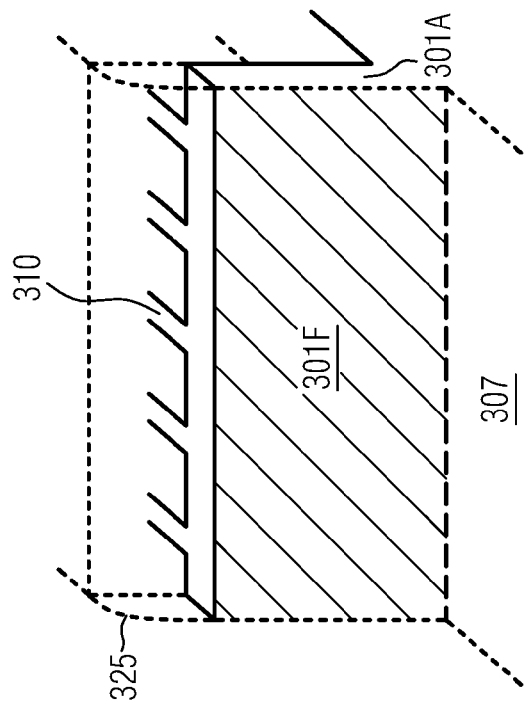

FIG. 3b schematically illustrates the device 300 in a perspective view after forming the cavities 307. As illustrated, the cavities 307 may comprise a sidewall surface 301F connecting to a portion of the active region 301A that is covered by the spacer structure 325 during the corresponding cavity etch process. Consequently, during a subsequent selective epitaxial growth process, a strain-inducing semiconductor material may be formed in the cavity 307 and may be in direct contact with the entire sidewall surface 301F. Thus, an efficient mechanical coupling of the strain-inducing semiconductor material to the semiconductor fins 310 may be achieved via the sidewall surface 301F, thereby providing a very efficient strain-inducing mechanism. In particular, the depth of the cavities 307 and thus the size of the sidewall surface 301F may be selected so as to obtain a desired high strain transfer efficiency, which may depend on the size and shape of the sidewall surface 301F.

Thus, after providing the cavities 307 with any desired size and shape, a desired semiconductor material may be deposited by using well-established process strategies. Thus, by selecting an appropriate spacer width of the structure 325 and selecting the size and shape of the cavities 307, performance characteristics of the three-dimensional transistors may be appropriately tuned, while the same process parameters may also be efficiently used for planar transistor devices.

Figure 3C:
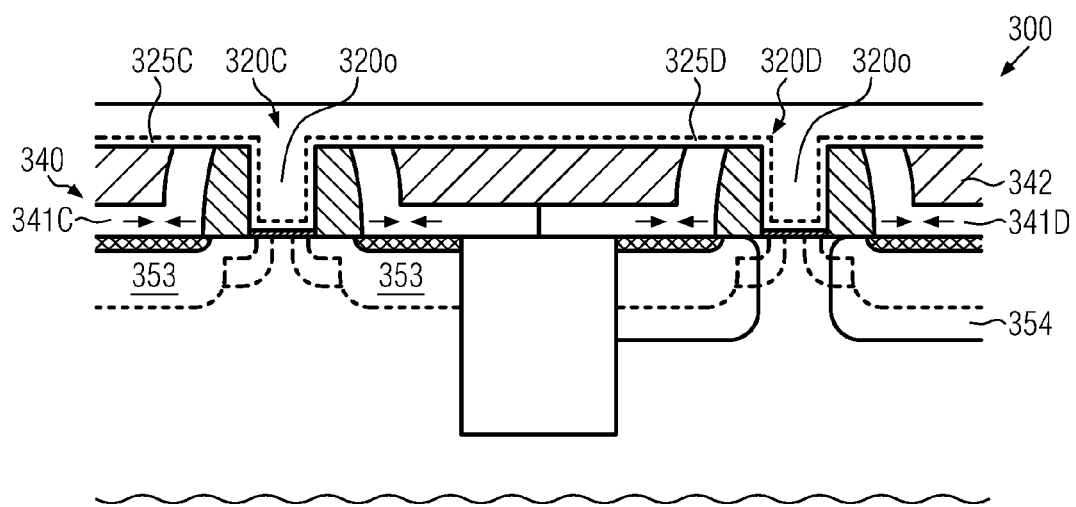
FIG. 3c schematically illustrates a cross-sectional view of planar transistors according to a replacement gate approach which may be applied to a three-dimensional transistor, possibly including a strain-inducing mechanism, according to illustrative embodiments.

FIG. 3c schematically illustrates the device 300 in cross-sectional view in planar transistor configurations for gate electrode structures 320C, 320D. As illustrated, the gate electrode structure 320C may represent the electrode structure of an N-channel transistor comprising strained source and drain regions 353, thereby also inducing a desired strain in the transistor channel. The strained drain and source regions 353 may be formed on the basis of stress memorization techniques, which may be understood as a technique in which the material in the drain and source areas may be amorphized, for instance by implanting the drain and source dopant species, and a regrowth of the amorphized semiconductor portions may be performed in the presence of a rigid overlayer, such as a spacer layer, which may be subsequently patterned into an appropriate spacer element, while nevertheless preserving a significant portion of the strain state in the re-crystallized drain and source regions. Thus, corresponding manufacturing techniques may also be readily applied to a three-dimensional transistor configuration, as is, for instance, shown in FIG. 3a, however, any corresponding cavities may not be required.

Similarly, the gate electrode structure 320D may represent the gate electrode structure of a P-channel transistor having incorporated a strain-inducing semiconductor alloy, such as a silicon/germanium alloy 354, which may be provided on the basis of process techniques as are described above with reference to FIGS. 3a and 3b. That is, material 354 as shown in FIG. 3c may be formed in the planar transistor illustrated and may concurrently be formed in a three-dimensional transistor, as explained above, wherein the size and shape of the corresponding cavities, such as the cavities 307 shown in FIGS. 3a and 3b may be, appropriately adjusted for the three-dimensional configuration and the planar transistor configuration in order to obtain the desired strain. Furthermore, in FIG. 3c, a contact level 340 is illustrated which may comprise one or more dielectric materials in order to laterally enclose the gate electrode structures 320C, 320D and also any other gate electrode structures of three-dimensional transistor configurations, as for instance previously explained with reference to the semiconductor device 200. For example, the contact level 340 may comprise a highly stressed dielectric material 341C, which may provide an appropriate strain component for an N-channel transistor, while a highly stressed material 341D may provide additional enhancement of the strain-inducing mechanism already provided on the basis of the material 354. Moreover, a further dielectric material 342, such as a silicon dioxide material, may be provided. The contact level 340 may be formed on the basis of any well-established process technique, wherein an efficient strain-inducing effect may also be achieved in the three-dimensional transistor configurations, as previously described.

Furthermore, in some illustrative embodiments, performance of the gate electrode structures 320C, 320D may be enhanced by providing superior material or material systems therein, for instance in the form of a high-k dielectric material, metal-containing electrode materials, highly conductive gate metals and the like. To this end, at least the polysilicon material may be removed in order to form corresponding openings 320o, which may be subsequently refilled with any appropriate materials. In some illustrative embodiments, strain-inducing metal-containing materials may be provided, for instance in the form of titanium nitride, tungsten and the like. Based on these materials, a high additional strain component may be achieved, thereby even further enhancing overall performance of the corresponding transistor devices. For example, titanium nitride may be provided with high compressive stress up to 8 GPa and higher, while tungsten may be provided with a high tensile stress of up to 1.5 GPa and higher. Thus, corresponding material layers 325C, 325D may be selectively provided for the gate electrode structures 320C, 320D, respectively. To this end, any well-established process techniques may be applied. Thereafter, any further materials may be formed in order to obtain the desired work function and thus threshold voltage and a high electrical conductivity.

Figure 3D:
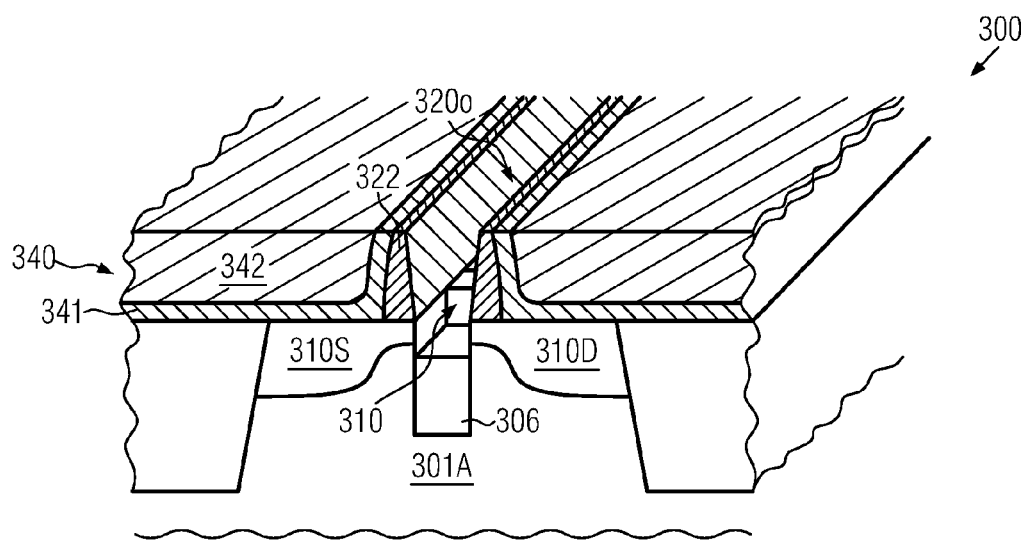
FIG. 3d schematically illustrates a perspective view of a three-dimensional transistor in an advanced manufacturing stage for applying a replacement gate approach, according to still further illustrative embodiments.

FIG. 3d schematically illustrates a perspective view of the semiconductor device 300 in a manufacturing stage which corresponds to the stage shown in FIG. 3c, however, for a three-dimensional transistor configuration. As illustrated, corresponding semiconductor fins 310 may be provided in a self-aligned manner within an active region 301A, in combination with a dielectric material 306, which may be accomplished on the basis of process techniques as previously described. Furthermore, the opening 320o may be provided within the gate electrode structure which is substantially represented by the spacer structure 322, possibly in combination with a gate dielectric material, which may be formed on any exposed surface areas of the active region 301A and the semiconductor fins 310. In other cases, the corresponding dielectric material may be removed and may be replaced by any other appropriate dielectric material, such as a high-k dielectric material and the like. The opening 320o may be formed together with the openings 320o as shown in FIG. 3c for the planar transistor configurations, since typically the etch chemistries used for forming the openings 320o may have a high degree of selectivity with respect to dielectric materials, such as silicon dioxide and the like, which may be provided as a gate dielectric material, thereby efficiently preserving integrity of the semiconductor fins 310 upon forming the opening 320o. Consequently, the further processing may be continued by depositing any appropriate materials, such as highly stressed metal-containing electrode materials and the like, as is also explained above with reference to FIG. 3c.

Consequently, very efficient strain-inducing mechanisms, replacement gate approaches and the like may be applied to the three-dimensional self-aligned transistor configurations, as described above.

As a result, the present disclosure provides three-dimensional transistor configurations, possibly in combination with planar transistors, in which the semiconductor fins of the three-dimensional transistors may be provided on the basis of a bulk configuration in a self-aligned manner by using a mask material having formed therein a gate opening, which defines the lateral size and position of the gate electrode structure. After forming the semiconductor fins selectively in some of the active regions within the gate openings and after providing an appropriate dielectric material for defining the effective height of the semiconductor fins, the further processing may be continued on the basis of "planar" process techniques, thereby enabling the implementation of highly efficient strain-inducing mechanisms and other sophisticated approaches, such as replacement gate approaches and the like.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a first mask layer above a semiconductor layer of a semiconductor device, said first mask layer comprising a gate opening that defines a lateral size and position of a gate electrode;
    forming a second mask layer in said gate opening, said second mask layer comprising a plurality of mask features defining a lateral size and position of a plurality of fins to be formed in said semiconductor layer;
    performing an etch process using said first and second mask layers to form said fins in a portion of said semiconductor layer and to define a space between said fins in said semiconductor layer, said space having sidewalls;
    removing said second mask layer;
    after removing said second mask layer, forming a dielectric material in said gate opening so as to adjust an electrically effective height of said plurality of fins by forming said dielectric material above said first mask layer and within said gate opening and removing a first excess portion of said dielectric material by using said first mask layer as a stop material, wherein removing the first excess portion of said dielectric material comprises performing a chemical mechanical planarization (CMP) process and using said first mask layer as a CMP stop layer;
    performing a single process operation to form a gate insulation layer on said fins and on said sidewalls of said space; and
    forming a gate electrode in said gate opening above said gate insulation layer.

2. The method of claim 1, wherein forming said first mask layer comprises forming a first sub-layer above said semiconductor layer and forming a second sub-layer on said first sub-layer, wherein said second sub-layer has an increased stop capability compared to said first sub-layer with respect to said CMP process.

3. The method of claim 2, wherein said second sub-layer is formed so as to comprise platinum.

4. The method of claim 1, wherein forming said dielectric material further comprises removing a second excess portion by performing an etch process so as to expose a target height of said plurality of fins.

5. The method of claim 1, further comprising forming drain and source regions in said semiconductor layer laterally adjacent to said gate electrode after removal of said first mask layer.

6. The method of claim 4, wherein forming said gate electrode comprises forming at least one of an electrode material and a placeholder material above said dielectric material and forming a mask material on said electrode material.

7. The method of claim 1, further comprising forming a cavity in said semiconductor layer adjacent to said gate electrode after removing said first mask layer and filling said cavity with a strain-inducing semiconductor material.

8. The method of claim 1, wherein forming said first mask layer comprises forming said first mask layer so as to receive a second gate opening that exposes a second portion of said semiconductor layer and forming a second gate electrode structure in said second gate opening without forming fins in said second portion of the semiconductor layer.

9. A method of forming a semiconductor device, the method comprising:
  forming a first gate opening and a second gate opening in a first mask layer that is formed above a semiconductor layer, said first and second gate openings defining a lateral position and size of a first gate electrode structure and a second gate electrode structure, respectively;
  forming a plurality of fins in said semiconductor layer through said first gate opening while masking said second gate opening;
  forming a first gate electrode structure in said first gate opening, said first gate electrode structure being in contact with said plurality of fins;
  adjusting an electrically effective height of said plurality of fins formed through said first gate opening by forming a dielectric material in said first and second gate openings with a predefined height level, wherein forming said dielectric material comprises:
    depositing said dielectric material above said mask layer and in said first and second gate openings;
    performing a planarization process using said mask layer as a stop layer; and
    removing an excess portion of said dielectric material in said first and second gate openings by performing an etch process;
  forming a second gate electrode in said second gate opening; and
  forming drain and source regions in said semiconductor layer adjacent to said first and second gate electrode structures.

10. The method of claim 9, further comprising forming a strain-inducing semiconductor material in said drain and source regions after removing said mask layer.

11. The method of claim 10, wherein forming said strain-inducing semiconductor material in said drain and source regions comprises performing at least one of an epitaxial growth process and a stress memorization process.

12. A method, comprising:
  forming a first mask layer above a semiconductor layer of a semiconductor device, said first mask layer comprising a gate opening that defines a lateral size and position of a gate electrode;
  forming a second mask layer in said gate opening, said second mask layer comprising a plurality of mask features defining a lateral size and position of a plurality of fins to be formed in said semiconductor layer;
  performing an etch process using said first and second mask layers to form said fins in a portion of said semiconductor layer;
  forming a dielectric material in said gate opening after forming said plurality of fins so as to adjust an electrically effective height of said plurality of fins, wherein forming said dielectric material comprises forming said dielectric material above said first mask layer and within said gate opening and removing a first excess portion of said dielectric material by performing a chemical mechanical planarization (CMP) process using said first mask layer as a CMP stop layer; and
  forming a gate electrode structure in said gate opening after removal of said second mask layer, said gate electrode structure comprising said gate electrode and connecting to said plurality of fins.

13. The method of claim 12, wherein forming said first mask layer comprises forming a first sub-layer above said semiconductor layer and forming a second sub-layer on said first sub-layer, wherein said second sub-layer has an increased stop capability compared to said first sub-layer with respect to said CMP process.

14. The method of claim 13, wherein said second sub-layer is formed so as to comprise platinum.

* * * * *